(12) United States Patent
Qiu et al.

(10) Patent No.: US 11,777,045 B2
(45) Date of Patent: *Oct. 3, 2023

(54) BACK CONTACT STRUCTURE AND SELECTIVE CONTACT REGION BURIED SOLAR CELL COMPRISING THE SAME

(71) Applicant: Solarlab Aiko Europe GmbH, Freiburg (DE)

(72) Inventors: Kaifu Qiu, Yiwu (CN); Yongqian Wang, Yiwu (CN); Xinqiang Yang, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/541,332

(22) Filed: Dec. 3, 2021

(65) Prior Publication Data
US 2022/0393052 A1 Dec. 8, 2022

Related U.S. Application Data

(63) Continuation of application No. 17/383,486, filed on Jul. 23, 2021, now abandoned.

(30) Foreign Application Priority Data

Jun. 4, 2021 (CN) .......................... 202110627510.1

(51) Int. Cl.
*H01L 31/05* (2014.01)
*H01L 31/068* (2012.01)

(52) U.S. Cl.
CPC ........ *H01L 31/0516* (2013.01); *H01L 31/068* (2013.01)

(58) Field of Classification Search
CPC ......... H01L 31/022441; H01L 31/0516; H01L 31/02363; H01L 31/028; H01L 31/068;
(Continued)

(56) References Cited

U.S. PATENT DOCUMENTS

2014/0360571 A1* 12/2014 Ji ........................ H01L 31/0745
 136/258
2016/0284896 A1* 9/2016 Westerberg ......... H01L 31/0288
2019/0386160 A1 12/2019 Seno et al.

FOREIGN PATENT DOCUMENTS

KR 20130037395 A 4/2013
WO WO-2013125036 A1 * 8/2013 ..... H01L 31/022441

OTHER PUBLICATIONS

English machine translation of WO 2013/125036A1. (Year: 2013).*

* cited by examiner

*Primary Examiner* — Michael Y Sun
(74) *Attorney, Agent, or Firm* — MATTHIAS SCHOLL P.C.; MATTHIAS SCHOLL

(57) ABSTRACT

A back contact structure includes: a silicon substrate including a back surface including a plurality of recesses disposed at intervals; a first dielectric layer disposed on the back surface of the silicon substrate; a plurality of first doped regions disposed on the first dielectric layer and disposed inside the plurality of recesses; a plurality of second doped regions disposed on the first dielectric layer and disposed outside the plurality of recesses; a second dielectric layer disposed between the first doped regions and the second doped regions; and a conductive layer disposed on the first plurality of doped regions and the plurality of second doped regions.

30 Claims, 11 Drawing Sheets

(58) Field of Classification Search
CPC ......... H01L 31/035281; H01L 31/0747; H01L 31/02167; H01L 31/02168; H01L 31/035272; H01L 31/056; H01L 31/0682; H01L 31/1804; H01L 31/1868; Y02E 10/52; Y02E 10/547
See application file for complete search history.

BACK CONTACT STRUCTURE AND SELECTIVE CONTACT REGION BURIED SOLAR CELL COMPRISING THE SAME

CROSS-REFERENCE TO RELATED APPLICATIONS

This application is a continuation of U.S. application Ser. No. 17/383,486, filed Jul. 23, 2021, now pending, and further claims foreign priority benefits to Chinese Patent Application No. 202110627510.1, filed Jun. 4, 2021. The contents of all of the aforementioned applications, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, MA 02142.

BACKGROUND

The disclosure relates to the field of solar cells, and more particularly to a back contact structure and a selective contact region buried solar cell comprising the same.

In a crystalline silicon solar cell, efficiency losses of the cell may be divided into two aspects, i.e., electric losses and optical losses. Important parts of the electric losses are composite losses and resistance losses caused by metal-semiconductor contacts, while an important part of the optical losses is a shading of metal grid lines of illuminated faces.

A passivated metal contact structure has remarkable electrical performance, and can obtain a low contact resistivity and low surface composition at the same time; this structure comprises an ultrathin tunneling oxide layer and an N-type doped or P-type doped polycrystalline silicon layer. Since the absorption of light by the doped polycrystalline silicon layer belongs to "parasitic" absorption, i.e., no contribution to a photo-generated current, the passivated metal contact structure is chiefly applied to a back of the cell, so that a front surface thoroughly avoids the shading of the metal grid lines. Solar radiation received on the solar cell generates electrons and holes; these electrons and holes are migrated to the doped polycrystalline silicon layer, to generate a voltage difference in the doped polycrystalline silicon layer.

The existing P-type doped polycrystalline silicon layer and the N-type doped polycrystalline silicon layer are directly deposited on a back of a silicon slice; however, when they are connected to each other without separation, undesirable phenomena such as electric leakage would occur. Hence, to solve the problem of no separation above, by forming an ultra-condensed trench between the P-type doped polycrystalline silicon layer and the N-type doped polycrystalline silicon layer, the P-type doped polycrystalline silicon layer is separated from the N-type doped polycrystalline silicon layer, to prevent electric leakage from reducing a cell open-circuit voltage. However, the existing trench is prepared through laser perforation or wet etching; in this case, since the width of the existing trench is dozens of microns, and thus width control is highly required, so that the preparation is difficult. Besides, the passivation is performed using only a single dielectric layer; however, using the single dielectric layer for passivation has a relatively poor passivation effect and a poor inner back reflection effect.

SUMMARY

An objective of the disclosure is to provide a back contact structure of a solar cell, aiming at solving the existing problems of a high trench width control requirement and a poor passivation effect.

The disclosure provides a back contact structure of a solar cell, the back contact structure comprising:
- a silicon substrate, the silicon substrate comprising a back surface comprising a plurality of recesses disposed at intervals;
- a first dielectric layer disposed on the back surface of the silicon substrate;
- a plurality of first doped regions disposed on the first dielectric layer and disposed inside the plurality of recesses;
- a plurality of second doped regions disposed on the first dielectric layer and disposed outside the plurality of recesses;
- a second dielectric layer disposed between the plurality of first doped regions and the plurality of second doped regions, where the second dielectric layer is at least one in number; and
- a conductive layer disposed on the first plurality of doped regions and the plurality of second doped regions.

In a class of this embodiment, the plurality of first doped regions is a P-type doped region, and the plurality of second doped regions is an N-type doped region; or the plurality of first doped regions is an N-type doped region, and the plurality of second doped regions is a P-type doped region.

In a class of this embodiment, the plurality of second doped regions are disposed on part of regions of the first dielectric layer outside the plurality of recesses.

In a class of this embodiment, the total thickness of the first dielectric layer and the plurality of first doped regions disposed in a recess is less than or equal to the depth of the recess.

In a class of this embodiment, the total thickness of the first dielectric layer and the plurality of first doped regions disposed in a recess is greater than the depth of the recess.

In a class of this embodiment, the plurality of first doped regions and the plurality of second doped regions comprise doped polycrystalline silicon, doped silicon carbide or doped amorphous silicon.

In a class of this embodiment, the first dielectric layer is one of a tunneling oxide layer, an intrinsic silicon carbide layer and an intrinsic amorphous silicon layer, or a combination thereof.

In a class of this embodiment, the second dielectric layer comprises an aluminum oxide layer, a silicon nitride layer, a silicon oxynitride layer, an intrinsic silicon carbide layer, an intrinsic amorphous silicon layer and a silicon oxide layer, or a combination thereof.

In a class of this embodiment, the second dielectric layer covers regions between the first doped regions and the second doped regions, or extends to cover the first doped regions and/or the second doped regions.

In a class of this embodiment, the part of the back surface of the silicon substrate between the plurality of first doped regions and the plurality of second doped regions comprises a rough texture structure.

In a class of this embodiment, the width of the P-type doped region is 300-600 μm, the width of the N-type doped region is 100-500 μm, and the depth of the plurality of recesses is 0.01-10 μm.

In a class of this embodiment, a horizontal distance between the first doped regions and the second doped regions is 0-500 μm.

In a class of this embodiment, the first dielectric layer covers the first doped regions and the second doped regions, or covers the entire back surface of the silicon substrate.

In a class of this embodiment, a plurality of third doped regions is disposed in the silicon substrate located on regions between the first doped regions and the second doped regions.

In a class of this embodiment, the first dielectric layer is connected to bottom walls and sidewalls of the plurality of recesses.

In a class of this embodiment, the first dielectric layer is connected to bottom walls of the recesses and the second dielectric layer is connected to sidewalls of the recesses.

In a class of this embodiment, the plurality of recesses is in the shape of an arc, a trapezoid, or a square.

In a class of this embodiment, the thickness of the first dielectric layer is 1-20 nm, and the total thickness of the first dielectric layer and the plurality of first doped regions or the plurality of second doped regions is greater than 20 nm.

In a class of this embodiment, the doped silicon carbide comprises doped hydrogenated silicon carbide.

In a class of this embodiment, the first dielectric layer is the tunneling oxide layer and the intrinsic silicon carbide layer.

In a class of this embodiment, the tunneling oxide layer comprises one or more of a silicon oxide layer and an aluminum oxide layer.

In a class of this embodiment, the intrinsic silicon carbide layer in the first dielectric layer comprises an intrinsic hydrogenated silicon carbide layer.

In a class of this embodiment, the second dielectric layer is the aluminum oxide layer and the intrinsic silicon carbide layer or the silicon oxide layer and the intrinsic silicon carbide layer, and the thickness of the second dielectric layer is greater than 25 nm.

In a class of this embodiment, the thickness of the aluminum oxide layer or the silicon oxide layer in the second dielectric layer is less than 25 nm, and the thickness of the intrinsic silicon carbide layer in the second dielectric layer is greater than 10 nm.

In a class of this embodiment, the intrinsic silicon carbide layer in the second dielectric layer comprises at least one first intrinsic silicon carbide film.

In a class of this embodiment, the refractive indexes of the first intrinsic silicon carbide films successively decrease outward from the back surface of the silicon substrate.

In a class of this embodiment, a magnesium fluoride layer is disposed at an outer layer of the second dielectric layer.

In a class of this embodiment, the conductive layer comprises a transparent conductive oxide (TCO) film and/or a metal electrode.

In a class of this embodiment, the metal electrode comprises a silver electrode, a copper electrode, an aluminum electrode, a tin-clad copper electrode, or a silver-clad copper electrode.

In a class of this embodiment, the copper electrode is electro-plated copper prepared through an electroplating process or a copper electrode prepared through physical vapor deposition.

In a class of this embodiment, a first dielectric layer corresponding to the first doped regions is the same as or different from a first dielectric layer corresponding to the second doped regions.

In a class of this embodiment, the first doped regions extend to part of the regions outside the plurality of recesses and are not connected to the adjacent second doped regions.

The objective of another embodiment of the disclosure is to further provide a selective contact region buried solar cell, comprising:
the aforesaid back contact structure; and
a third dielectric layer disposed on a front surface of the silicon substrate.

In a class of this embodiment, the third dielectric layer comprises an aluminum oxide layer, a silicon nitride layer, a silicon oxynitride layer, a silicon carbide layer, an intrinsic amorphous silicon layer and a silicon oxide layer, or a combination thereof.

In a class of this embodiment, the third dielectric layer comprises the silicon oxide layer and the silicon carbide layer, or the aluminum oxide layer and the silicon carbide layer, and the thickness of the third dielectric layer is greater than 50 nm.

In a class of this embodiment, the thickness of the aluminum oxide layer or the silicon oxide layer in the third dielectric layer is less than 40 nm, and the thickness of the silicon carbide layer in the third dielectric layer is greater than 10 nm.

In a class of this embodiment, the silicon carbide layer in the third dielectric layer comprises at least one silicon carbide film.

In a class of this embodiment, the refractive indexes of the silicon carbide films successively decrease outward from the front surface of the silicon substrate.

In a class of this embodiment, a magnesium fluoride layer is further disposed at an outer layer of the third dielectric layer.

In a class of this embodiment, an electric field layer or a floating junction is further disposed between the front surface of the silicon substrate and the third dielectric layer.

The objective of another embodiment of the disclosure is to further provide a cell assembly comprising the selective contact region buried solar cell as stated above.

The objective of another embodiment of the disclosure is to further provide a photovoltaic system, comprising the cell assembly as stated above.

The objective of another embodiment of the disclosure is to further provide a selective contact region buried solar cell manufacturing method, comprising:
forming a plurality of recesses disposed at intervals on a back of a silicon substrate;
preparing a first dielectric layer on the back surface of the silicon substrate;
respectively preparing first doped regions and second doped regions inside and outside the recesses;
respectively preparing a second dielectric layer and a third dielectric layer on the back and front surface of the silicon substrate; and
preparing a conductive layer on the first doped regions and the second doped regions.

In a class of this embodiment, the step of respectively preparing first doped regions and second doped regions inside and outside the recesses comprises:
depositing intrinsic amorphous silicon or intrinsic silicon carbide inside and outside the recesses; and
alternately performing different doping types of doping inside and outside the recesses; and
performing high temperature crystallization treatment, so that the intrinsic amorphous silicon or intrinsic silicon carbide is changed into doped polycrystalline silicon or doped silicon carbide to obtain the first doped regions disposed inside the recesses and the second doped regions outside the recesses.

In a class of this embodiment, the step of respectively preparing first doped regions and second doped regions inside and outside the recesses comprises:

depositing intrinsic amorphous silicon or intrinsic silicon carbide inside and outside the recesses; and alternately performing different types of diffusions inside and outside the recesses through a mask, so that the intrinsic amorphous silicon or intrinsic silicon carbide is changed into doped polycrystalline silicon or doped silicon carbide to obtain the first doped regions disposed inside the recesses and the second doped regions outside the recesses.

In a class of this embodiment, the step of respectively preparing first doped regions and second doped regions inside and outside the recesses comprises:

alternately depositing doped amorphous silicon or doped amorphous silicon carbide in different doping types inside and outside the recesses; and performing high temperature crystallization treatment, so that the doped amorphous silicon or doped amorphous silicon carbide is changed into doped polycrystalline silicon or doped silicon carbide to obtain the first doped regions disposed inside the recesses and the second doped regions outside the recesses.

In a class of this embodiment, the step of alternately performing different doping types of doping inside and outside the recesses comprises:

alternately injecting first-type ions or second-type ions for doping inside and outside the recesses; or alternately depositing first-type doping sources and second-type doping sources inside and outside the recesses; or alternately introducing first-type source gas and second-type source gas for doping inside and outside the recesses.

In the back contact structure provided in the embodiment of the disclosure, recesses are disposed at intervals on a back of a silicon substrate, and first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control than the existing trench, so the preparation of the recesses is easier than preparation of the existing trench. Further, when a first dielectric layer and first doped regions are deposited inside the recesses, the deposition effect is better because of the higher tolerance in width control. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer induced passivation is achieved at the back surface of the silicon substrate through the second dielectric layer having at least one layer, and then a better passivation effect is yielded and inner back reflection is enhanced, thereby solving the existing problems of a high trench width control requirement and a poor passivation effect and a poor inner back reflection.

DETAILED DESCRIPTION

Figure 1:
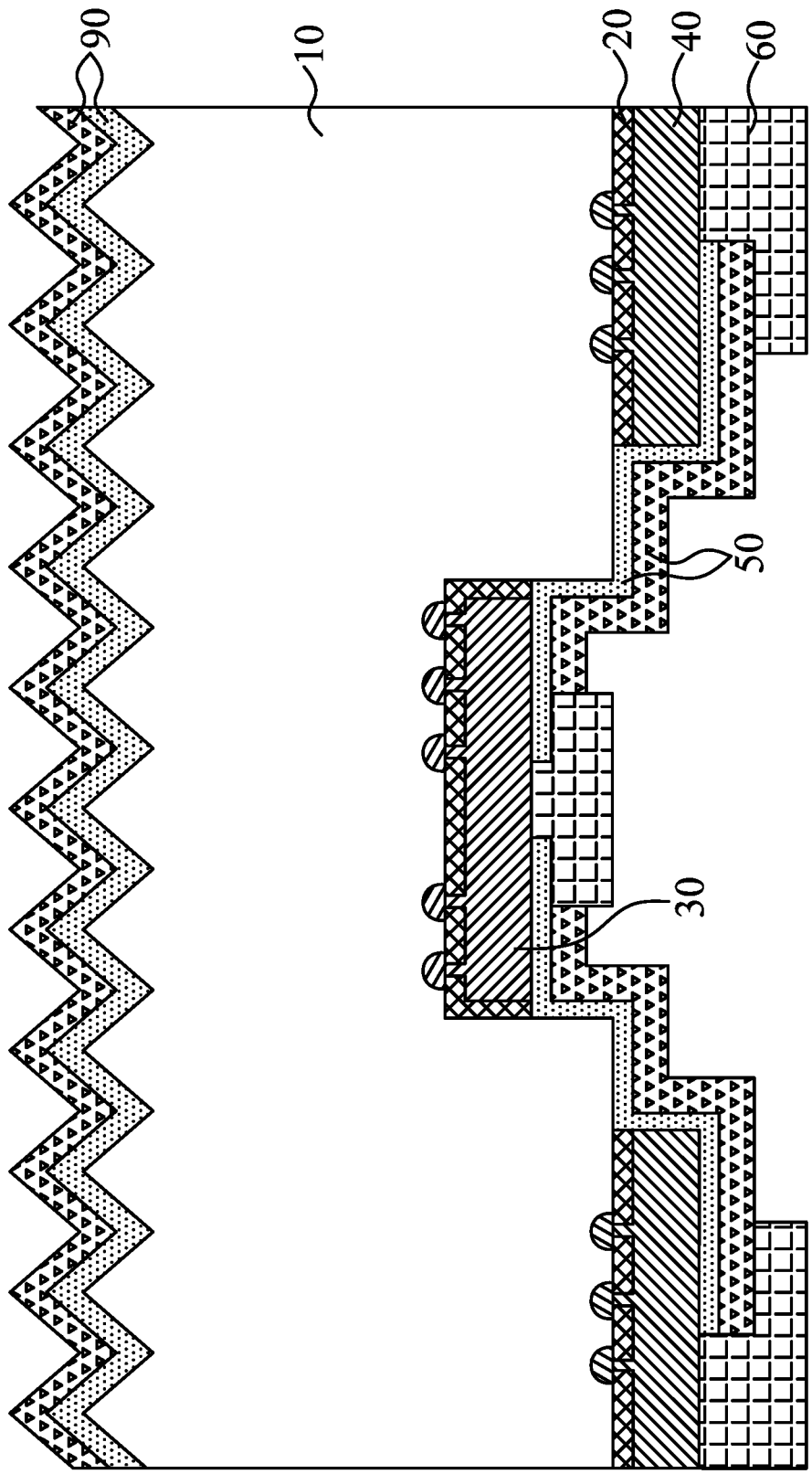
FIG. 1 to FIG. 10 are structural schematic diagrams of various implementations of a selective contact region buried solar cell provided by one embodiment of the disclosure.

To make the objective, technical solutions, and advantages of the disclosure clearer, the following further describes the disclosure in detail in conjunction with the accompanying drawings and embodiments. It should be understood that the specific embodiments described herein are merely used for explaining the disclosure but are not intended to limit the disclosure.

In the disclosure, unless otherwise specified and defined, the terms such as "mount", "connected with", "connected to" and "fix" should be comprehended in a broad sense. For example, these terms may be comprehended as being fixedly connected, detachably connected or integrally connected; or mechanically connected, or electrically connected; or directly connected, or indirectly connected through an intermediate medium, or in an internal communication between two elements. A person of ordinary skill in the art may understand specific meanings of the foregoing terms in the disclosure depending on a specific situation. The term "and/or" used in the text comprises any or all combinations of one or more related listed items.

In the disclosure, recesses are disposed at intervals on a back of a silicon substrate, and first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, so the preparation of the recesses is easier than preparation of the existing trench. Further, when a first dielectric layer and first doped regions are deposited inside the recesses, the deposition effect is better. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby solving the existing problems of a high trench width control requirement and a poor passivation effect and a poor inner back reflection.

Embodiment 1

The first embodiment of the disclosure provides a back contact structure of a solar cell. To facilitate explanation, merely the parts related to the embodiment of the disclosure are illustrated. With reference to FIG. 1 to FIG. 10, the back contact structure of the solar cell provided by the embodiment of the disclosure comprises:

a silicon substrate 10 comprising a back surface comprising a plurality of recesses disposed at intervals;
a first dielectric layer 20 disposed on the back surface of the silicon substrate 10;
a plurality of first doped regions 30 disposed on the first dielectric layer 20 and disposed inside the recesses;
a plurality of second doped regions 40 disposed on the first dielectric layer 20 and disposed outside the recesses;
a second dielectric layer 50 disposed between the first doped regions 30 and the second doped regions 40, where the second dielectric layer 50 is at least one in number and the refractive index successively decreases outward from the back surface of the silicon substrate 10; and
a conductive layer 60 disposed on the first doped regions 30 and the second doped regions 40.

In one embodiment of the disclosure, the silicon substrate 10 has a front facing the sun and a back opposite to the front during a normal working period, and the front is an illuminated face; the back is disposed on the other side of the silicon substrate 10 with respect to the front, i.e., the front and the back are located on different sides, i.e., opposite sides, of the silicon substrate 10, where in this embodiment, the silicon substrate 10 is an N-type silicon slice, and it can be understood that, in other embodiments, the silicon substrate 10 may also be another silicon slice. The recesses are formed at intervals on the back surface of the silicon substrate 10; the recesses can be formed through laser ablation or through a combination of a mask (such as a hard mask, a silicon oxide mask, a silicon nitride mask, and a photoresist mask) and wet/dry etching; in this case, due to the recesses formed at intervals on the back surface of the silicon substrate 10, a region between two adjacent recesses located on the silicon substrate 10 is roughly in a protrusion shape, and thus a back pattern of the silicon substrate 10 generally appears to be formed by staggering the recesses and protrusions.

Figure 2:
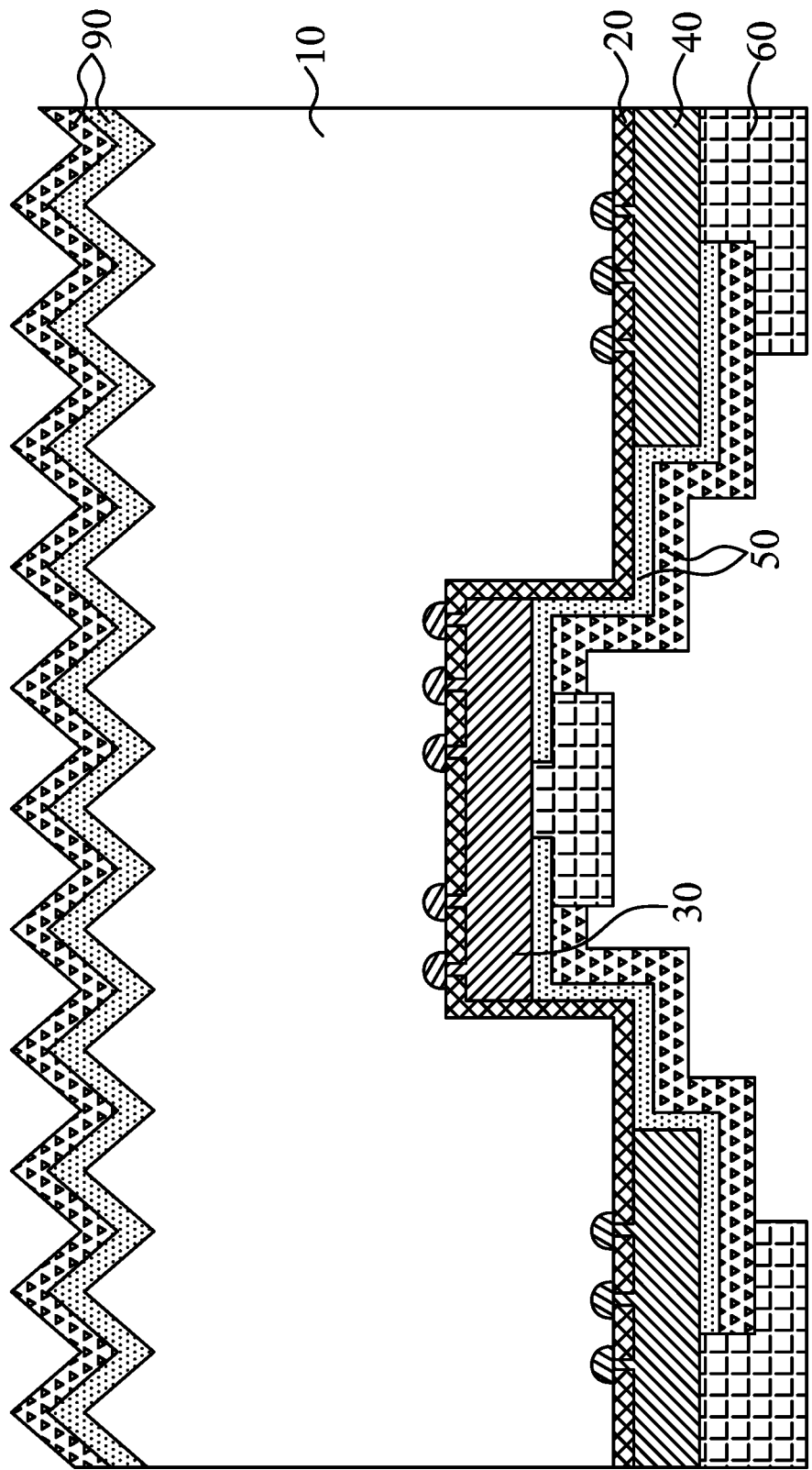
Figure 3:
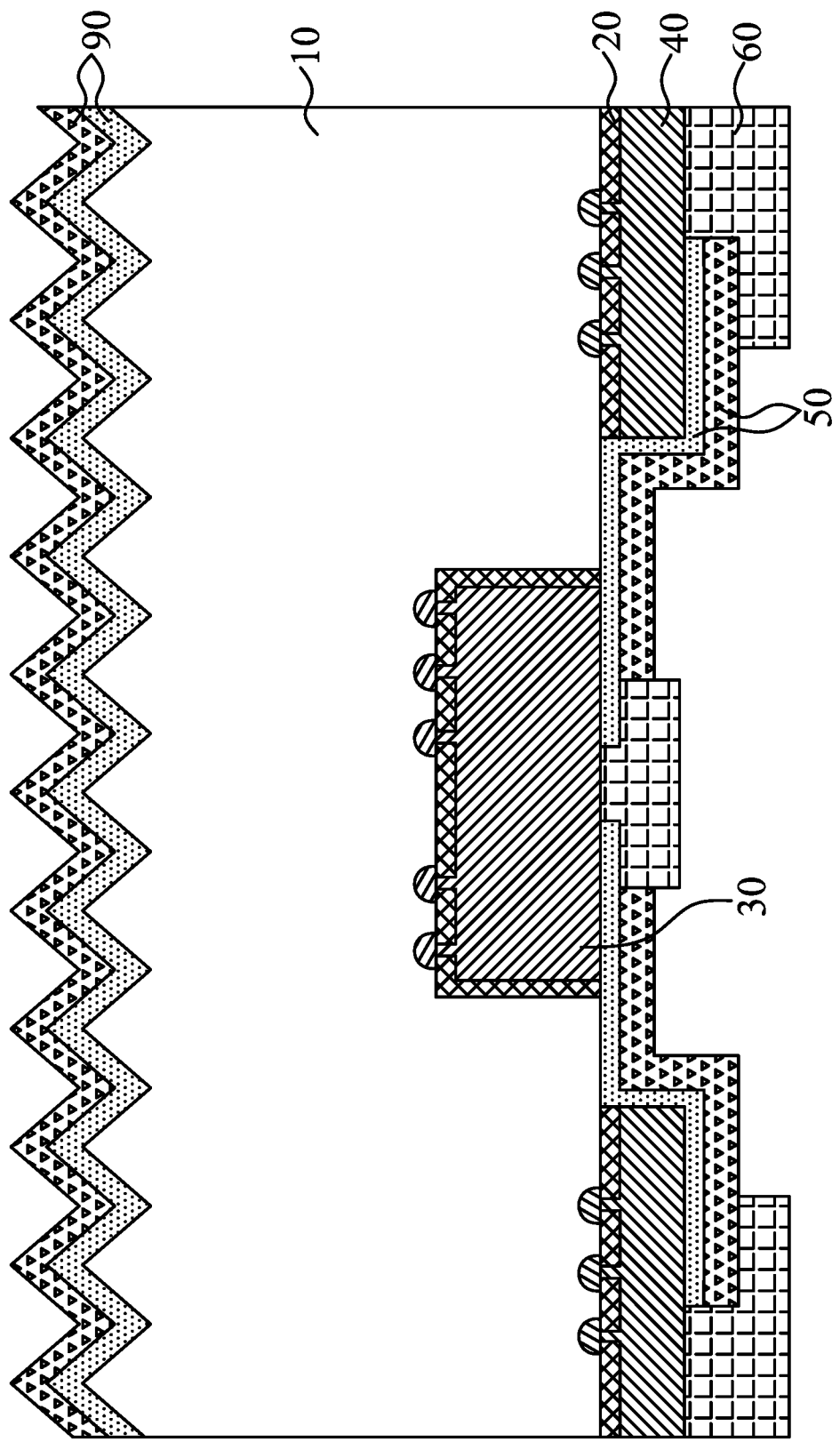
Figure 4:
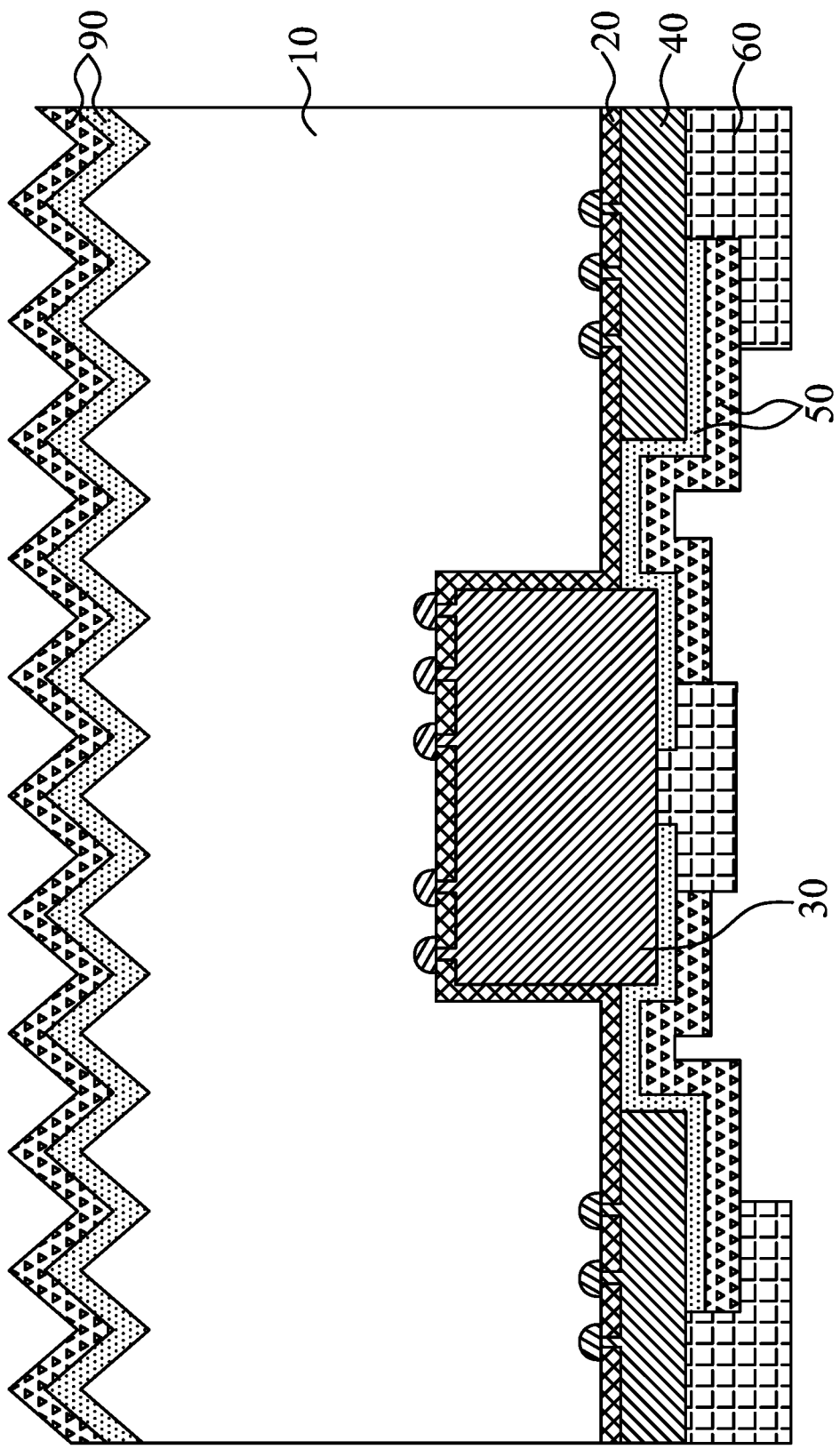

Furthermore, in one embodiment of the disclosure, the first dielectric layer 20 is located at the back surface of the silicon substrate 10 and at least covers the first doped regions 30 and the second doped regions 40; during specific implementation, the first dielectric layer 20 can only cover the first doped regions 30 and the second doped regions 40 or can further cover the entire back surface of the silicon substrate 10. In one embodiment of the disclosure, as shown in FIG. 1, the first dielectric layer 20 only covers the first doped regions 30 and the second doped regions 40; in this case, the back surface of the silicon substrate 10 located on regions between the first doped regions 30 and the second doped regions 40 is not covered by the first dielectric layer 20. In another embodiment of the disclosure, as shown in FIG. 2, the first dielectric layer 20 covers the entire back surface of the silicon substrate 10, i.e., the first dielectric layer 20 covers the entire back comprising the recesses and protrusions of the silicon substrate 10. It should be indicated that, as shown in FIG. 1 and FIG. 2, when the first dielectric layer 20 covers the first doped regions 30, the first dielectric layer 20 is connected to the bottom walls and sidewalls of the recesses.

Furthermore, in one embodiment of the disclosure, the first doped regions 30 are P-type doped regions and the second doped regions 40 are N-type doped regions; or the first doped regions 30 are N-type doped regions and the second doped regions 40 are P-type doped regions. That is, the first dielectric layer 20 and the P-type doped regions can be set inside the recesses and the first dielectric layer 20 and the N-type doped regions can be set outside the recesses; or the first dielectric layer 20 and the N-type doped regions are set inside the recesses and the first dielectric layer 20 and the P-type doped regions are set outside the recesses, so that the first dielectric layer 20 and the first doped regions 30 as well as the first dielectric layer 20 and the second doped regions 40 are alternately disposed inside and outside the recesses; in this case, separation between the first doped regions 30 inside the recesses and the second doped regions 40 outside the recesses is implemented through a silicon substrate inside the recesses that is not covered by the first doped regions 30 or a silicon substrate outside the recesses that is not covered by the second doped regions 40.

The first dielectric layer 20 is located on the silicon substrate 10 and between the first doped regions 30 disposed inside the recesses and the second doped regions 40 disposed outside the recesses, and is used as a tunneling structure; moreover, the first dielectric layer 20 and the highly doped first doped regions 30 or second doped regions 40 connected thereto and covered thereby together form a passivated contact structure. The passivated contact structure provides good surface passivation for the back surface of the silicon substrate 10; in addition, generally speaking, the first dielectric layer 20 has a thin enough thickness, in which one type of the carriers achieves selective transmission through a tunneling principle, while another type of the carriers is hard to tunnel through the first dielectric layer 20 due to the existence of a barrier and a doped region field effect. Therefore, the first dielectric layer 20 may allow one type of the carriers to tunnel through and enter the doped regions while blocking another type of the carriers from passing through to cause composition, so that interface composition can be obviously reduced, the solar cell has relatively high open-circuit voltage and short-circuit current, and then photovoltaic conversion efficiency is improved. Meanwhile, as shown in FIG. 1 to FIG. 10, a plurality of inner diffusion regions corresponding to the first doped regions 30 or second doped regions 40 are formed on the surface of the silicon substrate 10 in contact with the first dielectric layer 20. In addition, in this embodiment, since the arrangement of the recesses enables the first dielectric layer 20 to be in contact with both bottom walls and sidewalls of the recesses, the carriers generated in the silicon substrate 10 would also be easily separated through the first dielectric layer 20 on the sidewalls of the recesses and selectively collected into the corresponding first doped regions 30, thereby facilitating multi-dimensional collection of the carriers on the bottom walls and sidewalls of the recesses.

Furthermore, in one embodiment of the disclosure, the first dielectric layer 20 is preferably one of a tunneling oxide layer, an intrinsic silicon carbide layer and an intrinsic amorphous silicon layer, or a combination thereof. As some examples of the disclosure, for example, the first dielectric layer 20 may be a tunneling oxide layer of a single material, may also be a combination of a tunneling oxide layer and the intrinsic amorphous silicon layer of multiple materials, and may further be a combination of multiple layers of intrinsic amorphous silicon having different refractive indexes of a single material. It can be understood that the specific structural arrangement of the first dielectric layer 20 comprises, but not limited to, the several modes listed above, and according to actual usage needs, the first dielectric layer 20 is correspondingly configured, which is not specifically limited herein.

In a preferable embodiment of the disclosure, specifically, the first dielectric layer 20 is preferably the tunneling oxide layer and the intrinsic silicon carbide layer; in this case, the tunneling oxide layer and the intrinsic silicon carbide layer are successively arranged outward from the silicon substrate 10, the tunneling oxide layer is in contact with the back surface of the silicon substrate 10, and the intrinsic silicon carbide layer is in contact with the first doped regions 30 or the second doped regions 40. Furthermore, the tunneling oxide layer preferably comprises one or more of a silicon oxide layer and an aluminum oxide layer. Hence, the first dielectric layer 20 may also be a combination of the silicon oxide layer and the aluminum oxide layer in the tunneling oxide layer. The intrinsic silicon carbide layer in the first dielectric layer 20 comprises an intrinsic hydrogenated silicon carbide layer. In this case, the tunneling oxide layer and the intrinsic silicon carbide layer reduce the density of interface states between the silicon substrate 10 and the first doped regions 30 as well as the second doped regions 40 through chemical passivation. For example, hydrogen in the intrinsic hydrogenated silicon carbide layer enters the silicon substrate 10 under the function of a diffusion mechanism and a thermal effect, to neutralize dangling bonds of the back surface of the silicon substrate 10, to passivate defects of the back surface of the silicon substrate 10, and to transfer an energy band in a forbidden band to a valence band or a conduction band to improve probability for the carriers to enter the first doped regions 30 or the second doped regions 40 through the first dielectric layer 20.

Generally speaking, as some specific examples of the disclosure, during specific usage, the first dielectric layer 20 preferably adopts the silicon oxide layer of 1-2 nm and the intrinsic silicon carbide layer of 2-5 nm; as compared with only using the silicon oxide layer as the tunneling structure, the intrinsic silicon carbide layer may further provide an additional hydrogen passivation effect; a preparing process window of the tunneling structure is enlarged, without influencing the tunneling effect; certainly, the silicon oxide layer of 1-2 nm, or the silicon oxide layer of 1 nm and the aluminum oxide layer of 1 nm, or two or more of the intrinsic silicon carbide layers having different refractive indexes can also be directly adopted; as can be understood, the specific structure arrangement of the first dielectric layer 20 comprises, but not limited to, the several specific examples listed above. In addition, the first dielectric layer 20 may also be an intrinsic microcrystalline silicon layer, an intrinsic microcrystalline silicon oxide layer, an intrinsic amorphous silicon oxide layer, etc. As shown in FIG. 1 to FIG. 10, it is only shown that the first dielectric layer 20 is a one-layer structure; as can be understood, the specific structure of the first dielectric layer 20 is set according to actual needs and does not completely follow the accompanying drawings of the description.

It should be indicated that the first dielectric layer 20 only covers the first doped regions 30 and the second doped regions 40; since the first dielectric layers 20 are separated, the structure of the first dielectric layer 20 disposed on the first doped regions 30 and the second doped regions 40 can selected to be same or different, which specifically is: the first dielectric layer 20 corresponding to the first doped regions 30 is the same as or different from the first dielectric layer 20 corresponding to the second doped regions 40; for example, all of the first dielectric layers 20 may be selected as the silicon oxide layer and the intrinsic silicon carbide layer; the first dielectric layer 20 in the recesses provided with the first doped regions 30 can also be the silicon oxide layer and the intrinsic silicon carbide layer, and the first dielectric layer 20 in the protrusions provided with the second doped regions 40 is the aluminum oxide layer, the intrinsic silicon carbide layer, etc. According to actual usage needs, a film layer structure of the first dielectric layer 20 on each of the first doped regions 30 and the second doped regions 40 is correspondingly set, which is not specifically limited herein.

Furthermore, in one embodiment of the disclosure, the first doped regions 30 and the second doped regions 40 are respectively disposed inside and outside the recesses; the first doped regions 30 and the second doped regions 40 preferably comprise the doped polycrystalline silicon or doped silicon carbide or doped amorphous silicon, where the doped silicon carbide may comprise doped hydrogenated silicon carbide, and the doped hydrogenated silicon carbide is specifically formed by adding hydrogen when depositing the silicon carbide. It should be indicated that when the first dielectric layer 20 comprises the silicon oxide layer and the intrinsic silicon carbide layer, the plurality of first doped regions 30 and the plurality of second doped regions 40 are specifically doped silicon carbide. Moreover, when the first dielectric layer 20 comprises the silicon oxide layer or other combinations, the first doped regions 30 and the second doped regions 40 may be doped polycrystalline silicon or the like. When the first dielectric layer 20 is the intrinsic amorphous silicon layer, the first doped regions 30 and the second doped regions 40 are specifically doped amorphous silicon. Meanwhile, it should be indicated that the first doped regions 30 and the second doped regions 40 may be selected to be the same or different, for example, the first doped regions 30 and the second doped regions 40 are all doped polycrystalline silicon; or the first doped regions 30 are doped polycrystalline silicon, and the second doped regions 40 are doped silicon carbide, or the like; according to actual usage needs, the first doped regions 30 and the second doped regions 40 are correspondingly set, which is not specifically limited herein.

Figure 5:
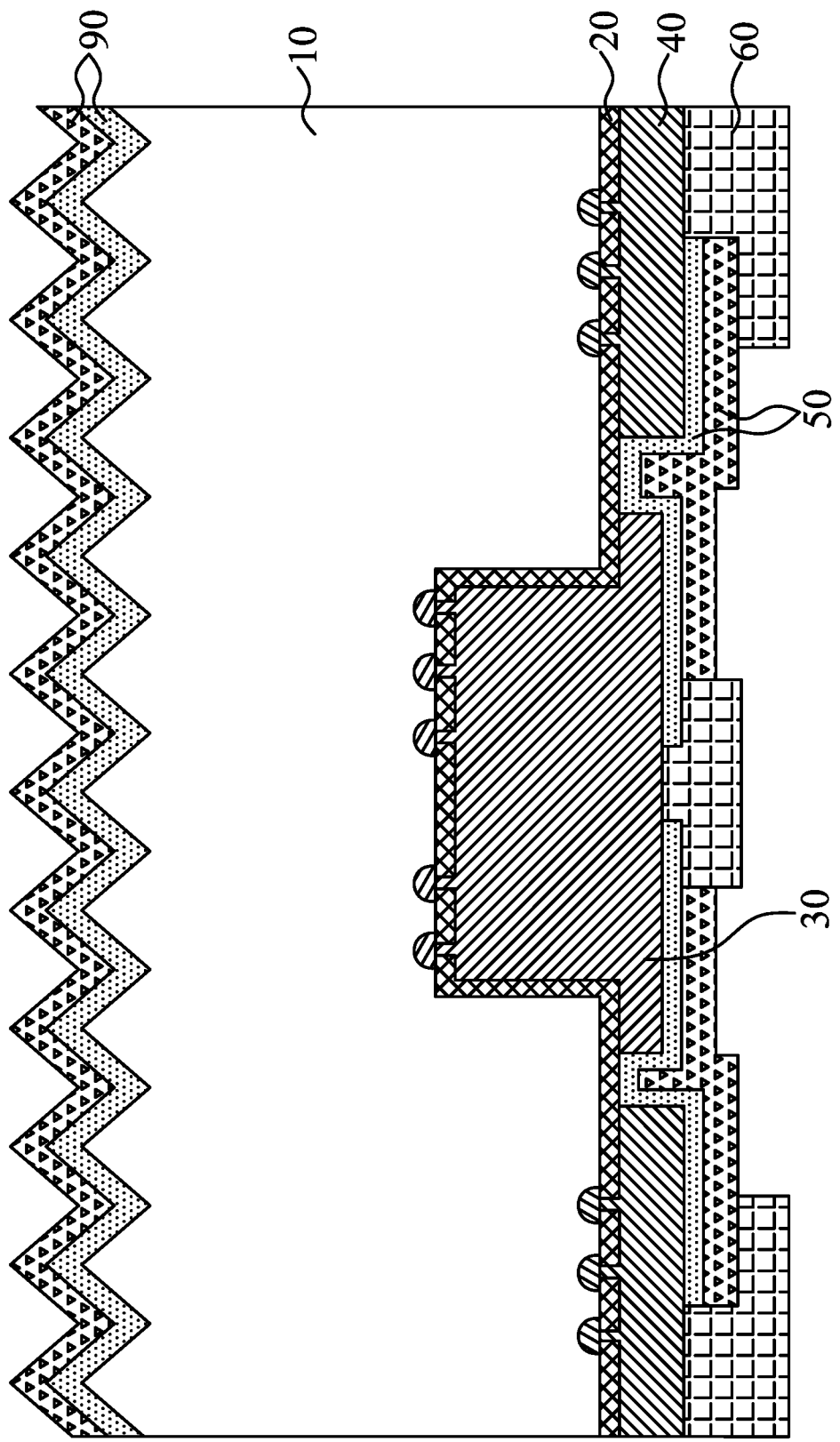

Furthermore, in one embodiment of the disclosure, the second doped regions 40 are disposed at part of regions outside the recesses; in this case, as shown in FIG. 1, since the second doped regions 40 are merely located at part of regions in the protrusions, through the silicon substrate 10 body, isolation between the first doped regions 30 and the second doped regions 40 can be implemented; in this case, the total thickness of the first dielectric layer 20 and the plurality of first doped regions 30 disposed in the recesses can be greater than or less than or equal to the depth of the recesses, i.e., the first doped regions 30 can be disposed inside the recesses and can also be disposed extending out of the recesses. Referring to FIG. 1 and FIG. 2, the total thickness of the first dielectric layer 20 and the plurality of first doped regions 30 is less than the depth of the recesses. Moreover, referring to FIG. 3, the total thickness of the first dielectric layer 20 and the plurality of first doped regions 30 is equal to the depth of the recesses. Moreover, referring to FIG. 4, the total thickness of the first dielectric layer 20 and the plurality of first doped regions 30 is greater than the depth of the recesses. It should be further indicated, in one embodiment of the disclosure, as shown in FIG. 5, when the first dielectric layer 20 covers the entire back surface of the silicon substrate 10 and the total thickness of the first dielectric layer 20 and the plurality of first doped regions 30 is greater than the depth of the recesses, the first doped regions 30 can further extend to part of regions of the protrusions outside the recesses and are not connected to the adjacent second doped regions 40; in this case, a passivated contact structure is also formed on the first dielectric layer 20 and the first doped regions 30 disposed on the protrusion regions outside the recesses, moreover, the first dielectric layer 20 and the first doped regions 30 in the recesses are communicated to increase a contact area of the first dielectric layer 20 through which the carriers selectively pass.

Figure 6:
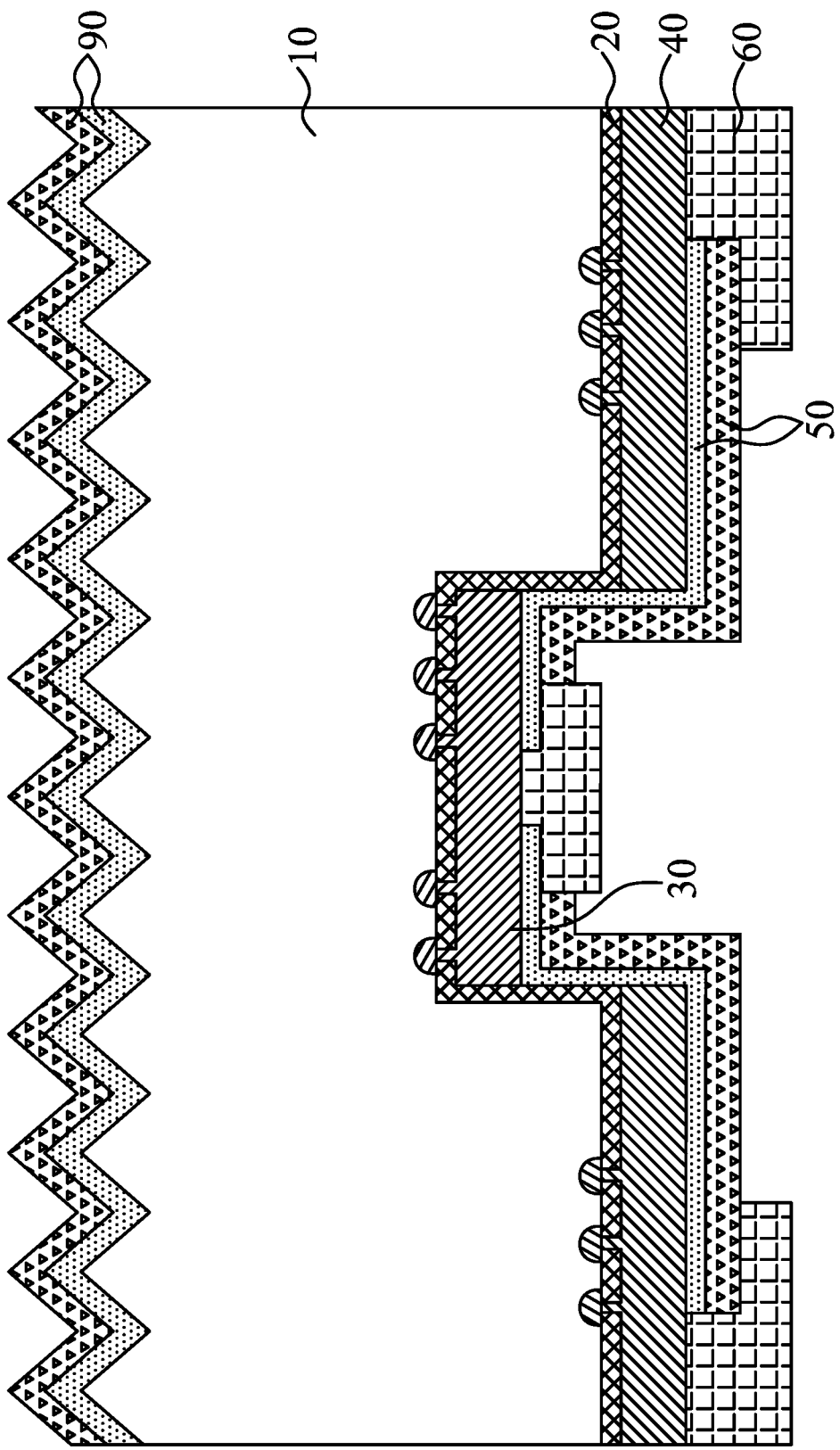

Furthermore, in other embodiments of the disclosure, the second doped regions 40 are disposed at all of regions outside the recesses; in this case, as shown in FIG. 6, since the second doped regions 40 are disposed on the entire protrusion outside the recesses, and therefore, to implement the isolation between the first doped regions 30 and the second doped regions 40, in this case, it is required to set the total thickness of the first dielectric layer 20 and the plurality of first doped regions 30 in the recesses to be less than or equal to the depth of the recesses, so that the isolation between the first doped regions 30 and the second doped regions 40 is implemented through a silicon substrate inside the recesses that is not covered by the first doped regions 30.

Furthermore, in one embodiment of the disclosure, the thickness of the first dielectric layer 20 is 1-20 nm, the total thickness of the first dielectric layer 20 and the plurality of first doped regions 30 is greater than 20 nm, and the total thickness of the first dielectric layer 20 and the plurality of second doped regions 40 is greater than 20 nm. Meanwhile, the horizontal distance between the first doped regions 30 and the second doped regions 40 is 0-500 µm, i.e., the second doped regions 40 may cover the entire protrusion to be adjacent to the first doped regions 30 in the horizontal direction, or the second doped regions 40 cover part of the regions outside the recesses. When the first doped regions 30 are P-type doped regions, the width of the recess of the P-type doped region is 300-600 µm, the width of the N-type doped region disposed in the protrusion is 100-500 µm, and the depth of the recess is 0.01-10 µm. When the first doped regions 30 are N-type doped regions, the width of the recess of the N-type doped region is 100-500 µm, the width of the P-type doped region in the protrusion is 300-600 µm, and the depth of the recess is 0.01-10 µm. As a preferable embodiment of the disclosure, the width of the P-type doped region is preferably 500 µm, the width of the N-type doped region is preferably 300 µm, and the distance between the first doped regions 30 and the second doped regions is preferably 100 µm. In view of the above, the width control requirement of dozens of microns for the set recess width is looser as compared with the existing trench; it would be easier to prepare it as compared with preparing the existing trench.

Figure 7:
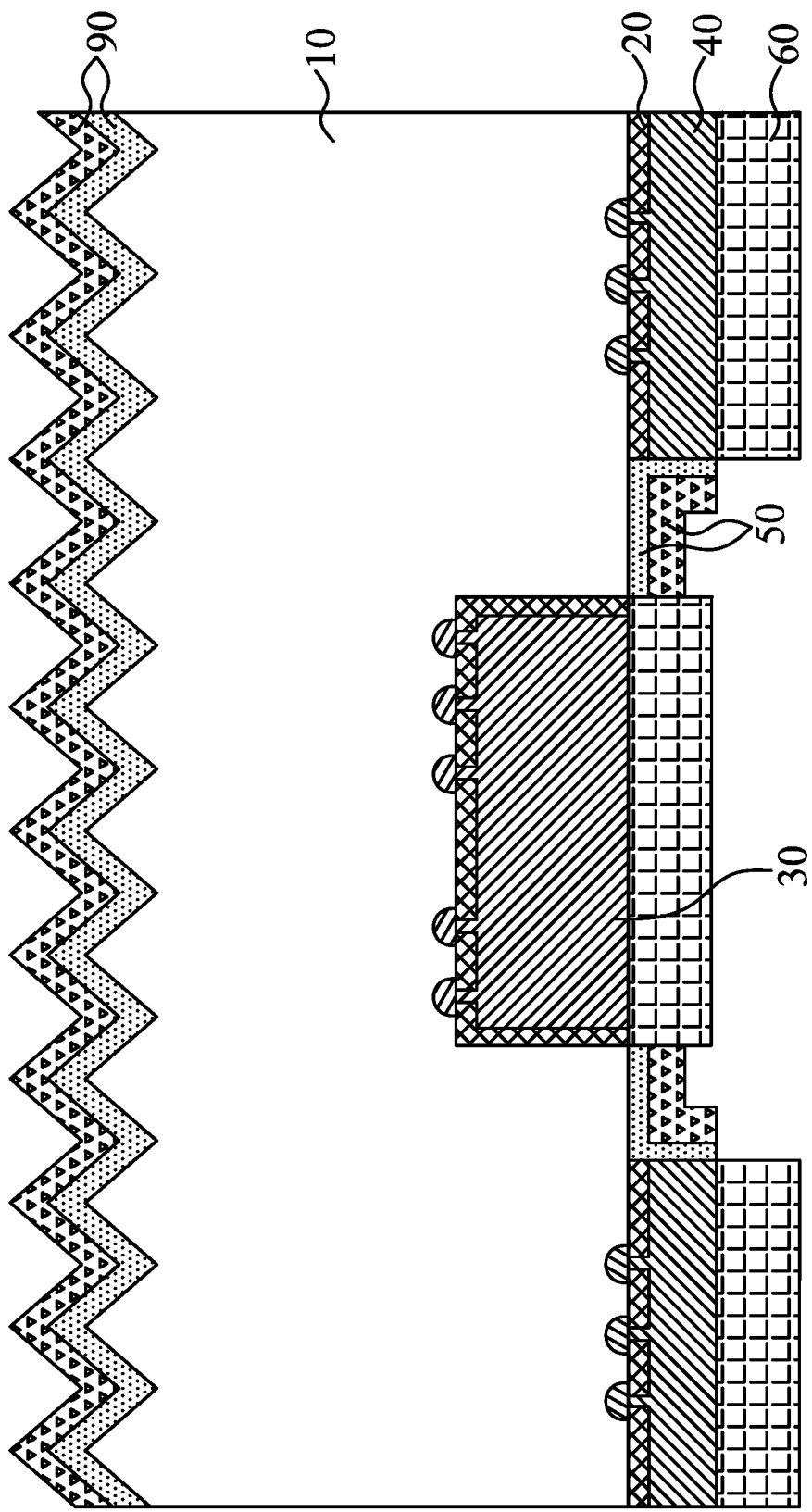

Furthermore, in one embodiment of the disclosure, the second dielectric layer 50 covers regions between the first doped regions 30 and the second doped regions 40, or extends to cover the first doped regions 30 and/or the second doped regions 40. That is, as shown in FIG. 7, the second dielectric layer 50 can only cover the regions between the first doped regions 30 and the second doped regions 40; correspondingly, in this case, the conductive layer 60 covers the entire back of the first doped regions 30 and the second doped regions 40 for electric connection. As shown in FIG. 1, the second dielectric layer 50 may also extend to cover the first doped regions 30 and/or the second doped regions 40 through the protrusions; correspondingly, the second dielectric layer 50 may extend to cover part of regions of the first doped regions 30, or extend to cover part of regions of the second doped regions 40, or extend to cover part of regions of the first doped regions 30 and the second doped regions 40; in this case, the conductive layer 60 covers the remaining part of back that does not cover the second dielectric layer 50 in the first doped regions 30 and the second doped regions 40, to form electric connections to the first doped regions 30 and the second doped regions 40, respectively. Certainly, during the preparing process of the second dielectric layer 50, the entire back of the back contact structure can also be completely covered, and in this case, when preparing the conductive layer 60, the conductive layer 60 penetrates through the second dielectric layer 50 by means of perforation or the like to form electric connections to the first doped regions 30 and the second doped regions 40, respectively. It should be indicated that when the first dielectric layer 20 merely covers the first doped regions 30 and the second doped regions 40, the second dielectric layer 50 is in direct contact with the back surface of the silicon substrate 10, as shown in FIG. 1. Moreover, when the first dielectric layer 20 covers the entire back surface of the silicon substrate 10, the second dielectric layer 50 is in contact with the first dielectric layer 20, as shown in FIG. 2.

Furthermore, in one embodiment of the disclosure, the second dielectric layer 50 is preferably selected from one of an aluminum oxide layer, a silicon nitride layer, a silicon oxynitride layer, an intrinsic silicon carbide layer, an intrinsic amorphous silicon layer and a silicon oxide layer, or a combination thereof. The second dielectric layer 50 plays a passivation function and the second dielectric layer 50 is at least set as a one-layer structure; the refractive index of each layer is set to successively decrease outward from the silicon substrate 10, so that the film layer adjacent to the silicon substrate 10 plays a passivation function, while the film layer away from the silicon substrate 10 plays an anti-reflection function, to enhance the anti-reflection effect, thereby increasing the absorption and usage of light by the silicon substrate 10, to increase the short-circuit current density. In addition, the second dielectric layer 50 may further be a doped silicon layer (such as a doped microcrystalline silicon layer, a doped amorphous silicon layer, and a doped polycrystalline silicon layer), a doped silicon carbide layer (such as a doped polycrystalline silicon carbide layer), a doped silicon oxide layer (such as a doped polycrystalline silicon oxide and doped amorphous silicon oxide), etc. In addition, each film layer of a different structure in the second dielectric layer 50 may comprise a plurality of films with different refractive indexes, and according to the fact that the refractive index of each film layer is set to successively decrease outward from the silicon substrate 10, for example, the silicon oxide layer in the second dielectric layer 50 may comprise a plurality of silicon oxide film layers having the refractive index successively decreasing outward from the silicon substrate 10.

As stated above, as some specific examples of the disclosure, for example, the second dielectric layer 50 may be a three-layer structure comprising the silicon oxide layer/aluminum oxide layer, intrinsic silicon carbide layer, and silicon nitride layer/silicon oxynitride layer; in this case, the thickness of the silicon oxide layer/aluminum oxide layer located at a first layer at an inner side is greater than 0.5 nm, the thickness of the intrinsic silicon carbide layer located at a second layer is greater than 1 nm, and the thickness of the silicon nitride layer/silicon oxynitride layer located at a third layer at an outer side is greater than 50 nm.

As some specific examples of the disclosure, for example, the second dielectric layer 50 may further be a two-layer structure comprising the aluminum oxide layer, and silicon nitride layer/silicon oxynitride layer; in this case, the thickness of the aluminum oxide layer located at a first layer at an inner side is greater than 1 nm, and the thickness of the silicon nitride layer/silicon oxynitride layer located at a second layer at an outer side is greater than 50 nm.

As some specific examples of the disclosure, for example, the second dielectric layer 50 may further be a three-layer structure comprising the silicon oxide layer/aluminum oxide layer, doped polycrystalline silicon layer/doped polycrystalline silicon carbide layer/doped polycrystalline silicon oxide layer, and silicon nitride layer/silicon oxynitride layer; in this case, the thickness of the silicon oxide layer/aluminum oxide layer located at a first layer at an inner side is 0.5-3 nm, the thickness of the doped polycrystalline silicon layer/doped polycrystalline silicon carbide layer/doped polycrystalline silicon oxide layer located at a second layer is 20-100 nm, and the thickness of the silicon nitride layer/silicon oxynitride layer located at a third layer at an outer side is greater than 50 nm.

As some specific examples of the disclosure, for example, the second dielectric layer 50 may further be a three-layer structure comprising the intrinsic amorphous silicon layer, doped amorphous silicon layer/doped amorphous silicon oxide layer, and silicon nitride layer/silicon oxynitride layer; in this case, the thickness of the intrinsic amorphous silicon layer located at a first layer at an inner side is 2-10 nm, the thickness of the doped amorphous silicon layer/doped amorphous silicon oxide layer located at a second layer is 2-50 nm, and the thickness of the silicon nitride layer/silicon oxynitride layer located at a second layer at an outer side is greater than 50 nm.

As some specific examples of the disclosure, for example, the second dielectric layer 50 may further be a three-layer structure comprising the silicon oxide/aluminum oxide layer, intrinsic silicon carbide layer/doped amorphous silicon oxide layer, and silicon nitride layer/silicon oxynitride layer; in this case, the thickness of the silicon oxide/aluminum oxide layer located at a first layer at an inner side is 0.5-3 nm, the thickness of the intrinsic silicon carbide layer/doped amorphous silicon oxide layer located at a second layer is 10-50 nm, and the thickness of the silicon nitride layer/silicon oxynitride layer located at a second layer at an outer side is greater than 50 nm.

As can be understood, the specific structure arrangement of the second dielectric layer 50 comprises, but not limited to, several specific examples listed above. In a preferable embodiment of the invention, as shown in FIG. 1, the second dielectric layer 50 is preferably a two-layer structure of an aluminum oxide layer and an intrinsic silicon carbide layer or a two-layer structure of a silicon oxide layer and an intrinsic silicon carbide layer, and in this case, the overall thickness of the second dielectric layer 50 is greater than 25 nm, where it is normally 70-80 nm during normal production and preparation. In this case, the intrinsic silicon carbide layer not only provides a hydrogen passivation effect, but also reduces parasitic light absorption due to a large optical band gap and a small absorption coefficient with respect to the intrinsic amorphous silicon layer, the doped polycrystalline silicon layer or the like. Furthermore, the thickness of the aluminum oxide layer or the silicon oxide layer in the second dielectric layer 50 is less than 25 nm, and the thickness of the intrinsic silicon carbide layer in the second dielectric layer 50 is greater than 10 nm. It should be indicated that in the multi-layer structure indicated in the embodiment of the disclosure, the order thereof is to arrange outward from the silicon substrate 10. For example, when the second dielectric layer 50 above is the aluminum oxide layer and intrinsic silicon carbide layer, the aluminum oxide layer is close to the silicon substrate 10, while the intrinsic silicon carbide layer is close to the outer side. Meanwhile, it should be indicated that in the accompanying drawings of the description, as shown in FIG. 1 to FIG. 10, it is only shown that the second dielectric layer 50 is a two-layer structure; as can be understood, the second dielectric layer 50 may further have other layer number, and the specific structure thereof is set according to actual needs and is not completely as shown in the accompanying drawings of the description. Meanwhile, it should be indicated that each of the accompanying drawings of the description is merely used for describing each specific structure distribution in the back contact structure thereof, but it does not correspond to the actual size dimension of each structure. For example, the thickness of the first dielectric layer 20 above is 1-20 nm, and the thickness of the second dielectric layer 50 is greater than 25 nm; in the accompanying drawings, they do not completely correspond to the specific actual size dimensions in this embodiment, and should depend on the specific parameters provided in this embodiment.

Furthermore, the intrinsic silicon carbide layer in the second dielectric layer 50 comprises at least one first intrinsic silicon carbide film. The refractive indexes of the first intrinsic silicon carbide films successively decrease outward from the back surface of the silicon substrate 10. Optionally, the refractive index of each material is generally selected as: the refractive index of monocrystalline silicon is 3.88; the refractive index of amorphous silicon is 3.5-4.2; the refractive index of polycrystalline silicon is 3.93; the refractive index of silicon carbide is 2-3.88; the refractive index of silicon nitride is 1.9-3.88; the refractive index of silicon oxynitride is 1.45-3.88; the refractive index of silicon oxide is 1.45; and the refractive index of aluminum oxide is 1.63. As can be understood, the refractive index of each material above may further be set as others according to actual usage needs, and is not specifically limited herein.

Furthermore, in one embodiment of the disclosure, a magnesium fluoride layer is further disposed at an outer layer of the second dielectric layer 50, i.e., based on the one of an aluminum oxide layer, a silicon nitride layer, a silicon oxynitride layer, an intrinsic silicon carbide layer, an intrinsic amorphous silicon layer and a silicon oxide layer, or a combination thereof selected by the second dielectric layer 50, the magnesium fluoride layer can further be disposed at the outer layer of the second dielectric layer 50. The refractive index requirement for the magnesium fluoride layer is the lowest, and generally, the refractive index thereof is set as 1.4, for enhancing the optical function of anti-reflection.

Furthermore, in one embodiment of the disclosure, the conductive layer 60 is a TCO film and/or a metal electrode. The metal electrode comprises a silver electrode, a copper electrode, an aluminum electrode, a tin-clad copper electrode, or a silver-clad copper electrode. Furthermore, the copper electrode is electro-plated copper prepared through an electroplating process or a copper electrode prepared through physical vapor deposition. For the electro-plated copper, nickel, chromium, titanium, and tungsten electrodes serve as a seed layer or a protective layer. When the back contact structure is applied to HBC cells (Interdigitated Back Contact (IBC) heterojunction solar cells) manufactured in low-temperature processes, the conductive layer 60 is a TCO film and a metal electrode, and when the back contact structure is applied to POLO-IBC cells (passivated contact IBC cells) manufactured in high-temperature processes, the conductive layer 60 is a metal electrode. However, it should be indicated that the metal electrode made of a low-temperature silver paste can only be applied to the HBC cells manufactured in low-temperature processes.

Figure 8:
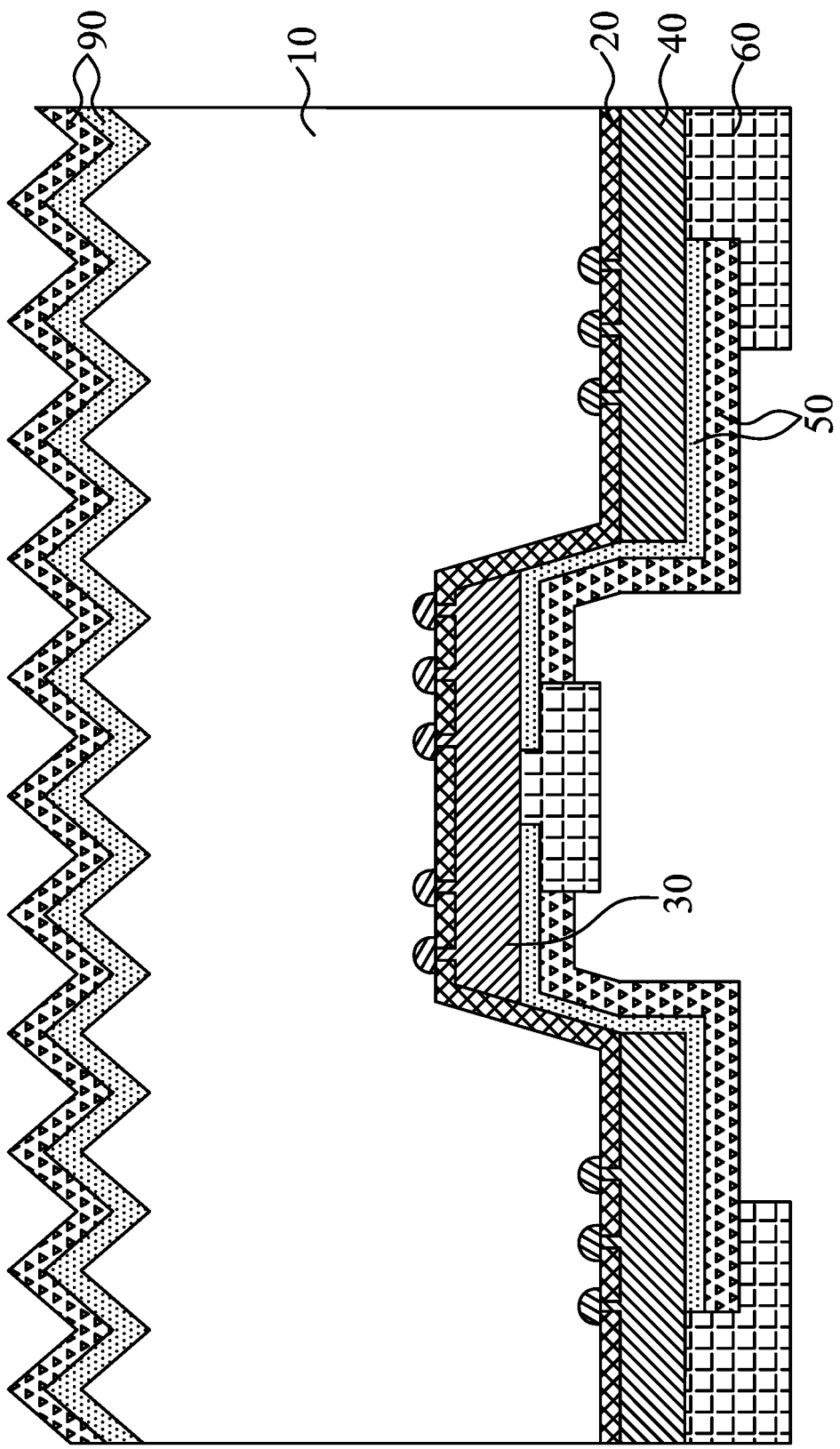

Furthermore, in one embodiment of the disclosure, the recess is in the shape of an arc, a trapezoid, or a square. As shown in FIG. 1, in a specific embodiment, the recess thereof is a square. As shown in FIG. 8, in another specific embodiment, the recess thereof is a trapezoid. The recess is preferably to be set as an arc or a trapezoid, because when the recess is set as an arc or a trapezoid, an effect of reflecting light by the inner wall of the recess is better, and the surface area of the first dielectric layer 20 specifically as the tunneling structure in contact with the silicon substrate 10 can further be increased. Certainly, when the recess is set as a square, the actual production process is simpler. Therefore, the shape of the recess is correspondingly set according to actual usage needs, which is not specifically limited herein.

It should be indicated that, in other embodiments of the disclosure, it is possible that the first dielectric layer 20 is connected to the bottom walls of the recesses and the second dielectric layer 50 is further connected to the sidewalls of the recesses. This is mainly because that the recess region is covered using the mask, and then when the mask is removed in a subsequent process, silicon in part of the silicon substrate 10 near the plurality of first doped regions 30 will be corroded to widen the recess; and when the second dielectric layer 50 is deposited in a subsequent process, the second dielectric layer 50 will be deposited in a blank region, so that the second dielectric layer 50 is connected to the sidewall of the recess. Or, when an arc-shaped recess (such as an ellipsoid-shaped recess) is prepared, there may be a case where the first dielectric layer 20 and the plurality of first doped regions 30 cannot be deposited onto the inner wall of the arc-shaped recess in the long-axis direction, and thus the blank region may be filled with the second dielectric layer 50 during deposition thereof so that the second dielectric layer 50 is connected to the sidewall of the arc-shaped recess, or there may be another case where the second dielectric layer 50 cannot be deposited to the blank region during deposition so that a certain gap is formed between the sidewall of the arc-shaped recess and the first dielectric layer 20 and the plurality of first doped regions 30. Absolutely, it should be indicated that in the back contact structure of the embodiments of the disclosure, it is preferable that the first dielectric layer 20 is directly connected to the sidewall of the recess, so that the first dielectric layer 20 disposed on the sidewall of the recess can allow selective pass-through of the carriers to achieve multi-dimension collection.

Figure 9:
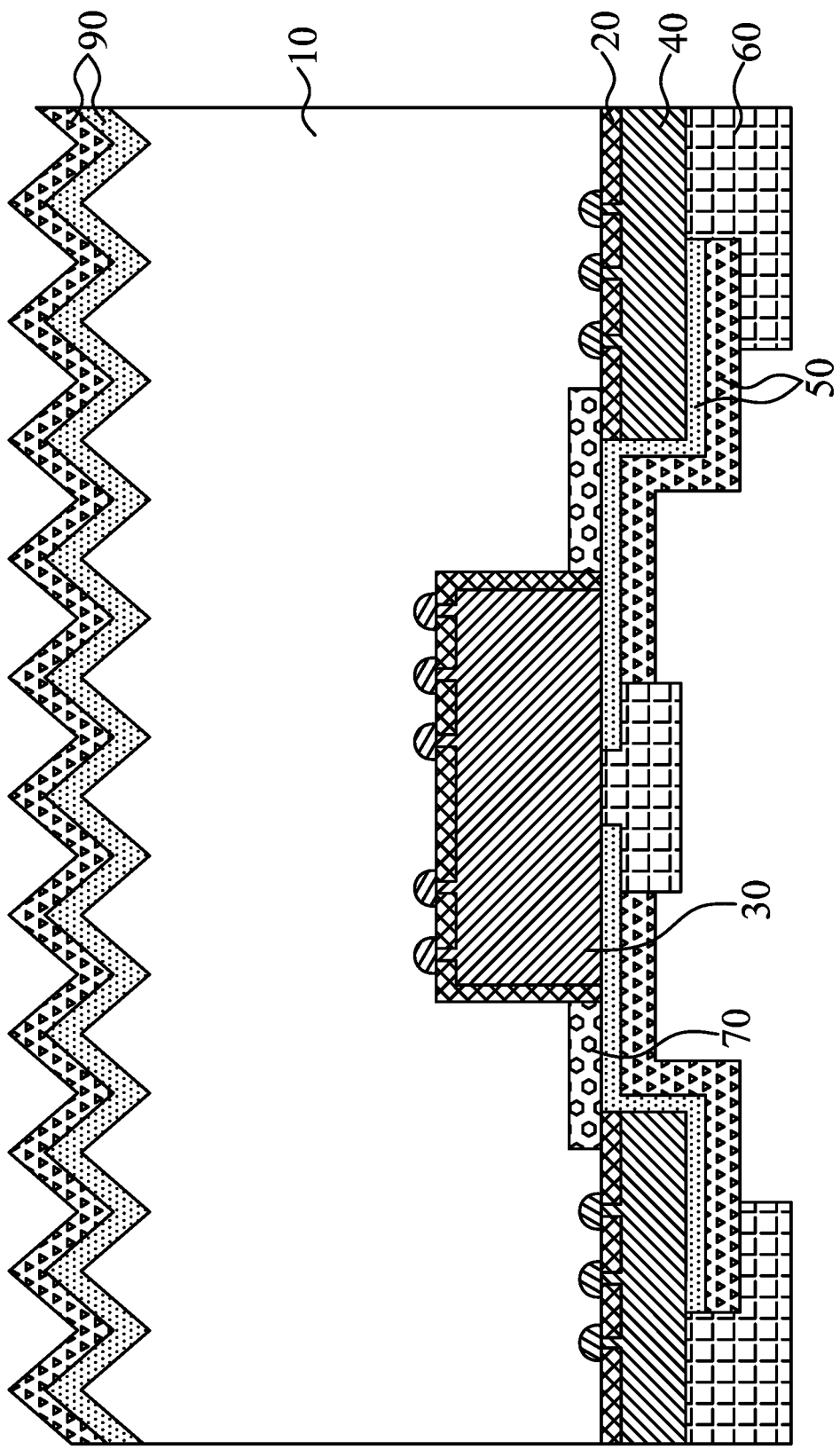

Furthermore, in one embodiment of the disclosure, as shown in FIG. 9, third doped regions 70 are disposed in the silicon substrate 10 located on regions between the first doped regions 30 and the second doped regions 40. That is to say, the third doped regions 70 may be disposed on the protrusions, taken as a whole, outside the recesses, and may also be disposed on part of the regions of the protrusions. The third doped region 70 is specifically a diffusion layer. The diffusion layer is a diffusion layer formed by doping different types of diffusion sources on the silicon substrate 10 of the protrusions, and thus is a diffusion layer formed by partially diffusing the silicon substrate 10 of the protrusions. The diffusion layer may be a P-type diffusion layer or an N-type diffusion layer, where the P-type diffusion layer is formed by diffusion of doped boron, aluminum, gallium or the like, and the N-type diffusion layer is formed by diffusion of doped nitrogen, phosphorus, arsenic or the like. In this case, the N-type diffusion layer is an N+ layer with respect to the silicon substrate 10 which is specifically an N-type silicon slice, i.e., the diffusion layer is formed by local heavy diffusion. It should be indicated that the third doped regions 70 disposed on the silicon substrate 10 may be correspondingly set as the P-type diffusion layers or the N-type diffusion layers according to actual usage needs, which is not specifically limited herein. Preferably, the P-type diffusion layers and the N-type diffusion layers are formed by alternately performing different types of diffusions on the protrusions of the silicon substrate 10. In this case, since the first dielectric layer 20 is disposed on the sidewalls of the recesses and the protrusions outside the recesses and the third doped regions 70 are formed by performing diffusion between the first doped regions 30 and the second doped regions 40 in the silicon substrate 10, it would be easier for the carriers in a third doped region 70 to selectively pass through the first dielectric layer 20 on the sidewall of the adjacent recess to be separated and collected into the corresponding plurality of first doped regions 30 and to selectively pass through the first dielectric layer 20 on the protrusion to be separated and collected into the corresponding plurality of second doped regions 40.

Figure 10:
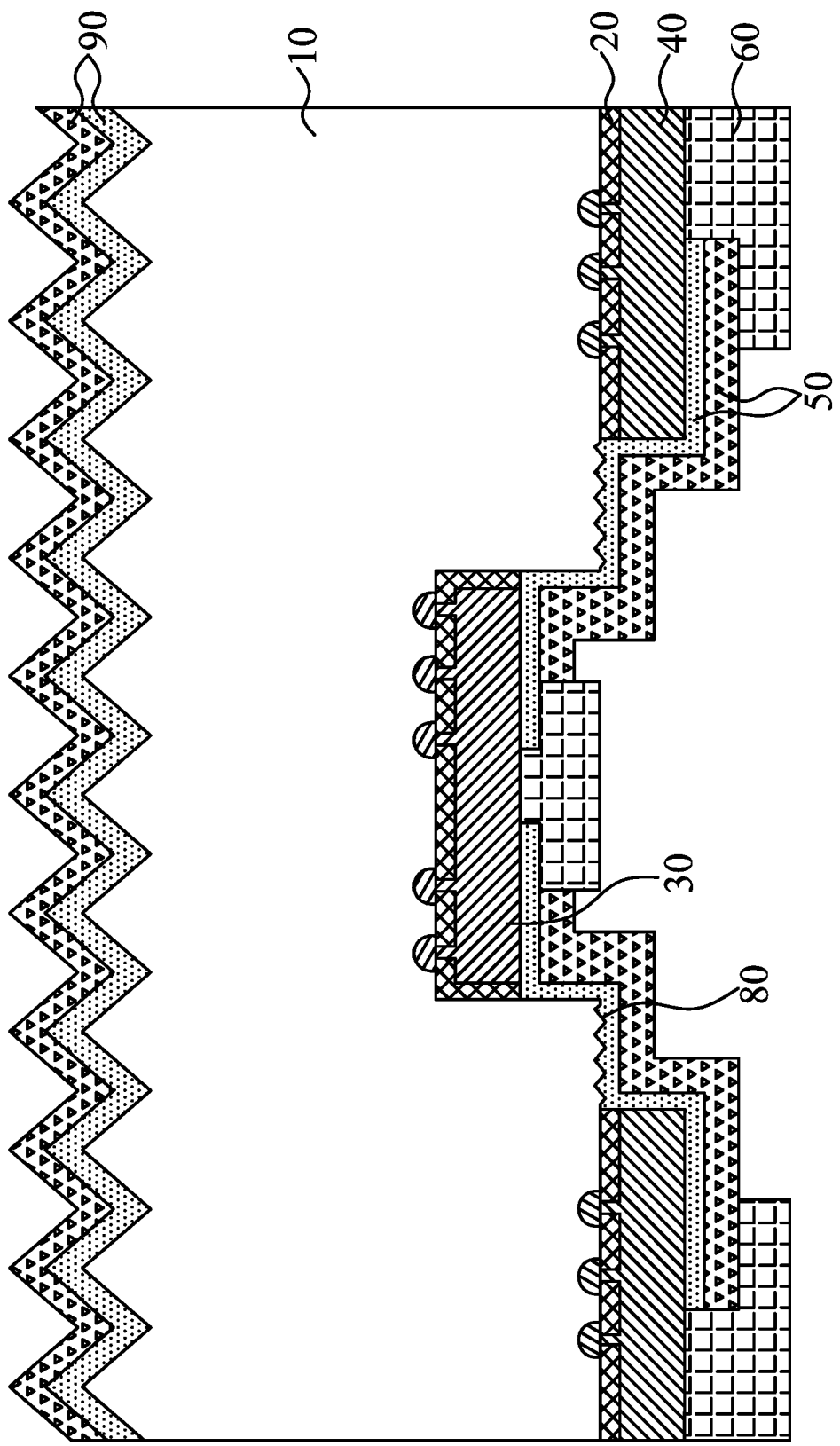

Furthermore, in one embodiment of the disclosure, as shown in FIG. 10, a back of a silicon substrate 10 located on regions between the first doped regions 30 and the second doped regions 40 comprises a rough texture structure 80. That is to say, the protrusion surface of the silicon substrate 10 thereof has the rough texture structure 80, where when the first dielectric layer 20 merely covers the first doped regions 30 and the second doped regions 40, the rough texture structure 80 is located at a position where the second dielectric layer 50 is in contact with the back surface of the silicon substrate 10; and when the first dielectric layer 20 covers the back of the entire silicon substrate 10, the rough texture structure 80 is located at a position where the first dielectric layer 20 is in contact with the back surface of the silicon substrate 10. The rough texture structure 80 is generally made through texturing, comprising forming hemispherical textures through acid texturing and forming pyramid-shaped textures through alkaline texturing, or forming pyramid-shaped textures through alkaline texturing and then performing rounding treatment on pyramid apexes through acid texturing. It should be understood that the rough texture structure 80 may also be disposed on the entire back surface of the silicon substrate 10, that is, the silicon substrate 10 inside the recesses also has the rough texture structure 80. In this case, the entire back surface of the silicon substrate 10 on which the recesses are formed is directly textured, without the subsequent process of removing the rough texture structure 80 in the first doped regions 30 and the second doped regions 40, so that the process is simplified. However, it should be indicated that in this embodiment, it is preferable that texturing is only performed on the surface of the silicon substrate 10 on regions between the first doped regions 30 and the second doped regions 40, to increase the reflection of the incident light inside the silicon substrate 10 to increase the absorption rate of light, while texturing is not performed on the surface of the silicon substrate 10 at the first doped regions 30 and the second doped regions 40.

By tests, with respect to the POLO-IBC cell prepared in an existing trench manner in the control group, the cell conversion efficiency of the HBC cell and the POLO-IBC cell prepared from the back contact structure provided in the embodiments of the disclosure can be effectively improved to about 26.0% and the reliability is greatly improved. Electrical performance results are shown in Table 1 below:

TABLE 1

| Name | UOC | JSC | FF | EF |
|---|---|---|---|---|
| HBC cell | 746 | 41.4 | 84.3% | 26.0% |
| POLO-IBC cell | 732 | 42.8 | 84.7% | 25.9% |
| Control group | 725 | 41.6 | 84.5% | 25.5% |

The embodiment of the disclosure has the following beneficial effects with respect to the related art:

1. The recesses are disposed at intervals on the back surface of the silicon substrate; moreover, first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, and preparation of the recesses is easier than preparation of the existing trench; moreover, when depositing the first dielectric layer and the first doped regions inside the recesses, the deposition effect thereof is better.

2. Since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed is at least one in number, multi-layer passivation is performed on the back surface of the silicon substrate through the second dielectric layer having at least one layer, to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. When the hard mask is used to selectively deposit the first doped regions or the second doped regions, for example, when the hard mask is used to deposit the first doped regions in the recess regions, the hard mask can be used to cover the protrusions outside the recesses. Moreover, since a recess has a specific depth, the hard mask will not be in direct contact with the bottom of the recess, so that the deposition effect is better. In addition, since the recesses are separated by the silicon substrate protrusion structure having a specific width, when the hard mask is used for covering to perform deposition of the recess regions, accurate alignment of the hard mask is not required and a moderate amount of deviation is allowed, so that the alignment of the hard mask gets simpler and then the technological difficulty is reduced.

6. In the related art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recesses is the protrusion, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

7. Since the third doped regions are disposed on regions between the first doped regions and the second doped regions in the silicon substrate, it would be easier for the carriers in a third doped region to selectively pass through the first dielectric layer on the sidewall of the adjacent recess to be separated and collected into the corresponding plurality of first doped regions and to selectively pass through the first dielectric layer on the protrusion to be separated and collected into the corresponding second doped region.

Embodiment 2

The second embodiment of the disclosure provides a selective contact region buried solar cell. To facilitate explanation, merely the parts related to the embodiment of the disclosure are illustrated. With reference to FIG. 1 to FIG. 10, the selective contact region buried solar cell provided by the embodiment of the disclosure comprises:
  a silicon substrate 10;
  the back contact structure disposed on a back surface of the silicon substrate 10 as stated in the foregoing embodiment; and
  a third dielectric layer 90 disposed on a front surface of the silicon substrate 10.

Furthermore, in one embodiment of the disclosure, the second dielectric layer 50 and the third dielectric layer 90 may be respectively prepared on the front and back surface of the silicon substrate 10 through a same process. In this case, the third dielectric layer 90 may have the same structure as the second dielectric layer 50 in the foregoing embodiment. Therefore, with reference to the foregoing embodiment, preferably, the third dielectric layer 90 may also be selected from one of an aluminum oxide layer, a silicon nitride layer, a silicon oxynitride layer, a silicon carbide layer, an intrinsic amorphous silicon layer and a silicon oxide layer, or a combination thereof.

As some examples of the disclosure, the third dielectric layer 90 may further have a three-layer structure comprising the silicon oxide layer/aluminum oxide layer and the doped polycrystalline silicon layer/doped polycrystalline silicon carbide layer/doped polycrystalline silicon oxide layer and the silicon nitride layer/silicon oxynitride layer, or a three-layer structure comprising the intrinsic amorphous silicon layer and the doped amorphous silicon layer/doped amorphous silicon oxide layer and the silicon nitride layer/silicon oxynitride layer, or a three-layer structure comprising the silicon oxide layer/aluminum oxide layer and the silicon carbide layer/doped amorphous silicon oxide layer and the silicon nitride layer/silicon oxynitride layer.

Furthermore, in one preferable embodiment of the disclosure, with reference to FIG. 1, preferably, the third dielectric layer 90 also correspondingly has a two-layer structure comprising the silicon oxide layer and the silicon carbide layer, or a two-layer structure comprising the aluminum oxide layer and the silicon carbide layer, and the thickness of the third dielectric layer 90 is greater than 50 nm. The thickness of the aluminum oxide layer or the silicon oxide layer in the third dielectric layer 90 is less than 40 nm, and the thickness of the silicon carbide layer in the third dielectric layer 90 is greater than 10 nm. In this case, the silicon carbide layer not only provides a hydrogen passivation effect, but also reduces parasitic light absorption due to a large optical band gap and a small absorption coefficient with respect to the intrinsic amorphous silicon layer, the doped polycrystalline silicon layer or the like. Furthermore, the silicon carbide layer in the third dielectric layer 90 comprises at least one silicon carbide film. The refractive indexes of the silicon carbide films successively decrease outward from the front surface of the silicon substrate 10. Furthermore, in one embodiment of the disclosure, a magnesium fluoride layer is further disposed at an outer layer of the third dielectric layer 90. The refractive index requirement for the magnesium fluoride layer at the outermost layer is the lowest, and generally, the refractive index is set as 1.4, for enhancing the optical function of anti-reflection.

Certainly, the third dielectric layer 90 may have a structural arrangement different from the second dielectric layer 50 in the foregoing embodiment, and the film structures of the second dielectric layer 50 and the third dielectric layer 90 are correspondingly set according to actual use needs, which is not specifically limited herein.

Furthermore, in one embodiment of the disclosure, an electric field layer or a floating junction is further disposed between the front surface of the silicon substrate 10 and the third dielectric layer 90, specifically comprising performing phosphorus diffusion on the silicon substrate 10 to obtain the electric field layer or performing boron diffusion to obtain the floating junction. In this case, the electric field layer or the floating junction serves as a Front-Surface Field (FSF) of the selective contact region buried solar cell.

In this embodiment, recesses are disposed at intervals on a back of a silicon substrate, and first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, and preparation of the recesses is easier than preparation of the existing trench. Further, when a first dielectric layer and first doped regions are deposited inside the recesses, the deposition effect is better. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

Embodiment 3

Figure 11:
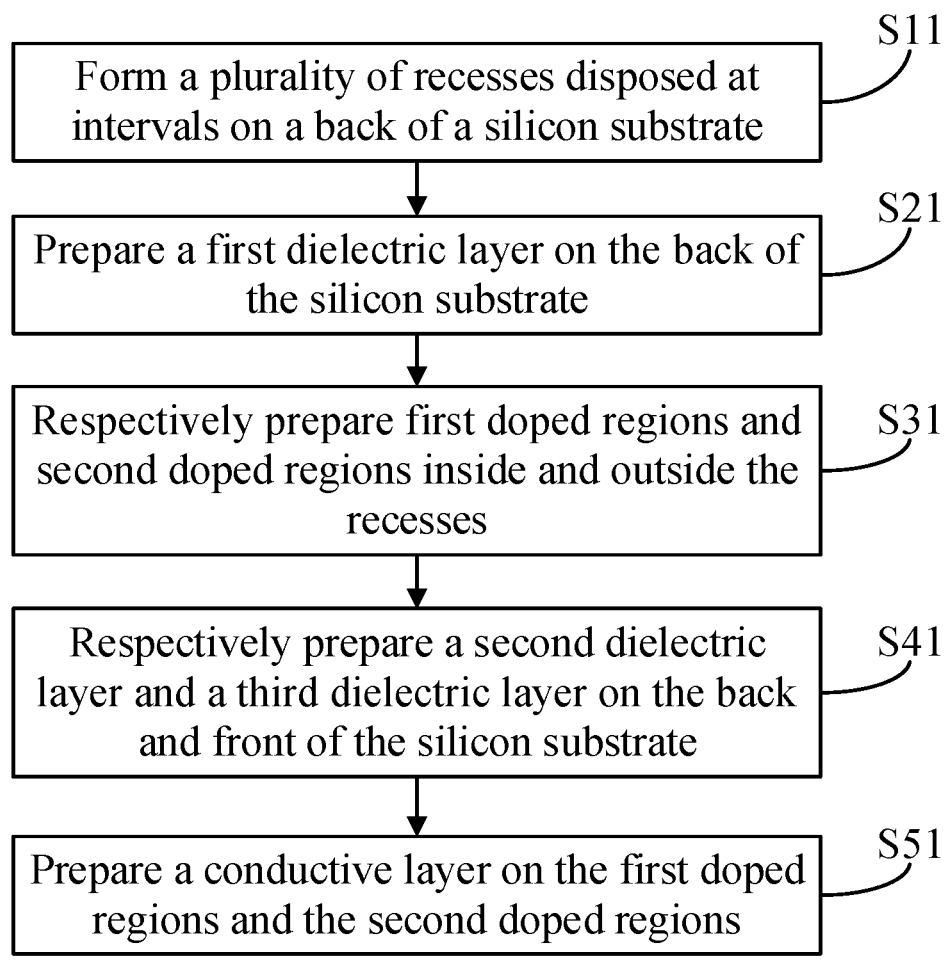
FIG. 11 is a flow chart of a selective contact region buried solar cell manufacturing method provided by another embodiment of the disclosure.

The third embodiment of the disclosure provides a selective contact region buried solar cell manufacturing method. To facilitate explanation, merely the parts related to the embodiment of the disclosure are illustrated. With reference to FIG. 11, the selective contact region buried solar cell manufacturing method provided by the embodiment of the disclosure is used for preparing the selective contact region buried solar cell as stated in the preceding embodiment, and specifically, the method comprises the following steps.

At step S11, a plurality of recesses is formed at intervals on a back of a silicon substrate.

Before step S11, it should further comprise pre-treating the silicon substrate.

The pre-treatment above comprises cleaning the silicon substrate and removing a damaged layer. Specifically, the pre-treatment comprises:

(1) performing RCA standard cleaning to remove particles, organic matters, or the like on the surface of the silicon substrate;

(2) placing the cleaned silicon substrate in a 2-5% potassium hydroxide (KOH) solution or tetramethylammonium hydroxide (TMAH) solution (i.e., a developing solution) for treatment at a temperature of 50-80° C. for 1-5 min, to remove a surface damaged layer caused in a slicing process;

(3) performing pickling on the surface of the silicon substrate using HCl, to neutralize the alkaline solution left on the surface of the silicon substrate and remove metal impurities left on the surface of the silicon slice; and (4) cleaning the silicon substrate using an HF solution, to remove a silicon oxide layer on the surface of the silicon slice and form a Si—H passivation bond with a dangling bond on the surface of the silicon substrate, and finally, performing drying using nitrogen for use.

Furthermore, after the silicon substrate is pre-treated, the recesses may be formed in the following ways:

way I: the part where the recesses need to be disposed at intervals is directly slotted through laser and partial silicon crystal is removed from the back surface of the silicon substrate, to form the desired recesses; way II: the silicon substrate is subjected to thermal oxidation treatment so that a silicon oxide layer is formed on the entire surface of the silicon substrate, silicon oxide in part of the regions on the front and back surface of the silicon substrate is removed through laser slotting, and then silicon oxide is removed using an acid (such as HF) through wet etching, to form the desired recesses; way III: a silicon nitride layer is deposited on the back surface of the silicon substrate through PECVD, silicon nitride in part of the region on the back is removed through laser slotting, and then silicon nitride is removed through wet etching, to form the desired recesses; way IV, silicon nitride is deposited on the back surface of the silicon substrate or the silicon substrate is subjected to thermal oxidation treatment to form silicon oxide, a photoresist mask is then deposited on the back, developing is enabled on a developing region through exposure using a patterned screen, the developing region is removed with a wet method using a developing agent, silicon nitride/silicon oxide in the developing region is removed using an acid (such as HF), and the photoresist mask and silicon nitride/silicon oxide are removed through wet etching, to form the desired recesses; and way V: a patterned paste is printed on the back surface of the silicon substrate as a mask, and the paste is then removed through wet etching, to form the desired recesses.

In the embodiment of the disclosure, way II is preferably used for forming the recesses, where in way II, the thermal oxidation treatment step specifically comprises: performing dry-oxygen oxidation/steam oxidation/wet-oxygen oxidation (i.e., dry-oxygen+steam) in a quartz tube, where specific reactants comprise oxygen and/or high-purity steam, the reaction pressure is 50-1000 mbar, the reaction temperature is 900-1200° C., and the thickness of silicon oxide prepared from the reaction is greater than 10 nm. The step of removing silicon oxide through laser slotting specifically comprises: removing silicon oxide to be removed through slotting by laser having a laser wavelength of 532 nm, a laser power of 10-60 W, a laser frequency less than or equal to 250-1500 KHz, and a laser pulse width of 3-50 ns. An alkaline solution and isopropyl acetone are used in the wet etching step, where the alkaline solution is KOH or TMAH, the concentration of the alkaline solution is 1-5%, the content of isopropyl acetone is 1-10%, the reaction temperature is 60-85° C., and the reaction time is 10-30 min. An acidic solution in the step of removing silicon oxide using the acid is HF, where the concentration of the acidic solution is 1-5%, the reaction temperature is room temperature, and the reaction time is 3-10 min.

Specifically, after the recess is formed through way II, the depth of the formed recess is 0.01-10 μm. The formed recess may be an arc, a trapezoid, or a square. Since trench used in the related art are prepared by laser perforation or wet etching, the width control requirement for the trench is high and it is difficult to prepare. However, preparation of the recesses in this embodiment is easier than preparation of existing trench, and does not have a strict width control requirement as the existing trench.

At step S21, a first dielectric layer is prepared on the back surface of the silicon substrate.

Before step S21, the specific production process may further comprise texturing the front surface of the silicon substrate. In this embodiment, texturing on the front is mainly achieved by corrosion using an alkaline solution, where the alkaline solution reacts with the silicon substrate to generate a water-soluble compound, and a pyramid-shaped textured structure is formed on the surface. In this case, due to the existence of the textured structure, after incident light is reflected by the textured surface for the first time, reflected light does not directly enter the air, but enters the air after encountering the adjacent textured surface and being reflected by the textured surface for the second time or even for the third time. Therefore, the incident light is used for multiple times, thereby reducing the reflectivity of the front. When the back surface of the silicon substrate also needs to have a rough texture structure, the front and back surface of the silicon substrate can be textured at the same time; and when the back surface of the silicon substrate does not need to have a rough texture structure, a silicon nitride protection layer is deposited on the back surface of the silicon substrate, the front is then textured, and the silicon nitride protection layer is removed from the back through laser, thereby avoiding texturing on the back surface of the silicon substrate.

Specifically, the first dielectric layer is prepared on the back surface of the silicon substrate according to a high-temperature oxidation process, a deposition process or the like, which is set depending on the type of the first dielectric layer to be specifically deposited and is not specifically limited therein. In this case, the first dielectric layer is one of a tunneling oxide layer, an intrinsic silicon carbide layer and an intrinsic amorphous silicon layer, or a combination thereof, and the thickness of the first dielectric layer is 1-20 nm. In this case, the first dielectric layer covers the entire back surface of the silicon substrate. However, when there is no need to dispose the first dielectric layer on regions between the first doped regions and the second doped regions in the silicon substrate, the first dielectric layer covering the regions between the first doped regions and the second doped regions in the silicon substrate can be removed through laser.

At step S31, the first doped regions and the second doped regions are respectively prepared inside and outside the recesses.

The respectively preparing first doped regions and second doped regions inside and outside the recesses comprises two deposition modes for preparation, i.e., in-situ deposition and ex-situ deposition.

Specifically, in one embodiment of the disclosure, when adopting in-situ deposition, step S31 comprises:
  alternately depositing doped amorphous silicon or doped amorphous silicon carbide in different doping types inside and outside the recesses; and
  performing high temperature crystallization treatment, so that the doped amorphous silicon or doped amorphous silicon carbide is changed into doped polycrystalline silicon or doped silicon carbide to obtain the first doped regions disposed inside the recesses and the second doped regions outside the recesses.

In a feasible solution, specifically, when a recess is subjected to in-situ deposition of the plurality of first doped regions (specifically, such as the P-type doped region), the position of the protrusion where deposition is not required is covered with a mask method. In this case, in-situ deposition with P-type amorphous silicon/P-type amorphous silicon carbide is performed in the recess. It should be correspondingly indicated that the recess has a specific depth, the mask is positioned against the protrusion and thus will not directly contact the bottom of the recess, so that impurity contamination at the bottom of the recess can be reduced. Moreover, after deposition in the recesses is completed, the mask (such as the silicon nitride mask or the silicon oxide mask) on the protrusions or impurity contamination caused by the mask (such as the hard mask) can be removed through laser; then the recesses are shielded through the mask to perform in-situ deposition with N-type amorphous silicon/N-type amorphous silicon carbide on the parts of the second doped regions on the protrusions outside the recesses where deposition is required; and after the P-type amorphous silicon/P-type amorphous silicon carbide and the N-type amorphous silicon/N-type amorphous silicon carbide are alternately deposited inside and outside the recesses, the temperature is increased to 700-1000° C. directly using a high-temperature or laser heating method. Therefore, after high-temperature crystallization treatment, the P-type amorphous silicon/P- type amorphous silicon carbide and the N-type amorphous silicon/N-type amorphous silicon carbide inside and outside the recesses are changed into P-type polycrystalline silicon/P-type silicon carbide and N-type polycrystalline silicon/N-type silicon carbide, to obtain the first doped regions (i.e., the P-type doped regions) disposed inside the recesses and the second doped regions (i.e., the N-type doped regions) disposed outside the recesses. The mask may be a hard mask, a silicon nitride mask, a silicon oxide mask, a photoresist mask, etc. Since in in-situ deposition of doped amorphous silicon or doped silicon carbide, deposition may be performed on the sides and front surface of the silicon substrate, after high-temperature crystallization, it is required to add wet etching treatment to achieve bypass plating.

In another feasible solution, specifically, in-situ deposition of the first doped regions (specifically, such as the P-type doped regions) is performed on the entire back surface of the silicon substrate. In this case, P-type amorphous silicon/P-type amorphous silicon carbide is deposited on the entire back surface of the silicon substrate; the P-type amorphous silicon/P-type amorphous silicon carbide on all the regions outside the recesses in the silicon substrate is removed through laser ablation; N-type amorphous silicon/N-type amorphous silicon carbide is deposited on the entire back surface of the silicon substrate; then the N-type amorphous silicon/N-type amorphous silicon carbide on regions other than the second doped regions on the protrusions in the silicon substrate is completely removed through laser ablation; and the temperature is increased to 700-1000° C. directly using a high-temperature or laser heating method. Therefore, the P-type amorphous silicon/P-type amorphous silicon carbide and the N-type amorphous silicon/N-type amorphous silicon carbide inside and outside the recesses are changed into P-type polycrystalline silicon/P-type silicon carbide and N-type polycrystalline silicon/N-type silicon carbide, to obtain the first doped regions disposed inside the recesses and the second doped regions disposed outside the recesses.

Specifically, in one embodiment of the disclosure, when adopting ex-situ deposition, step S31 comprises:
  depositing intrinsic amorphous silicon or intrinsic silicon carbide inside and outside the recesses; and
  alternately performing different doping types of doping inside and outside the recesses; and
  performing high temperature crystallization treatment, so that the intrinsic amorphous silicon or intrinsic silicon carbide is changed into doped polycrystalline silicon or doped silicon carbide to obtain the first doped regions disposed inside the recesses and the second doped regions outside the recesses.

The step of alternately performing different doping types of doping inside the recesses specifically comprises:
  alternately injecting first-type ions or second-type ions for doping inside and outside the recesses; or
  alternately depositing first-type doping sources and second-type doping sources inside and outside the recesses; or
  alternately introducing first-type source gas and second-type source gas for doping inside and outside the recesses.

In a feasible solution, specifically, intrinsic amorphous silicon or intrinsic silicon carbide is deposited inside the recesses; different types of ions are respectively injected inside and outside the recesses, for example, when the first doped regions inside the recesses are the P-type doped regions, P-type ions containing elements such as boron, aluminum, gallium or the like are injected inside the recesses, and N-type ions containing elements such as nitrogen, phosphorus, arsenic or the like are injected on part of regions outside the recesses; and then high-temperature crystallization treatment is performed so that the original intrinsic amorphous silicon or intrinsic silicon carbide is changed into doped polycrystalline silicon or doped silicon carbide. Since in deposition with intrinsic amorphous silicon/intrinsic silicon carbide, deposition may be performed on the sides and front surface of the silicon substrate, after high-temperature crystallization, it is required to add wet etching treatment to achieve bypass plating.

In a feasible solution, specifically, intrinsic amorphous silicon or intrinsic silicon carbide is deposited inside and outside the recesses; different doping types of doping sources are alternately deposited inside and outside the recesses with a mask method for doping, for example, when the first doped regions are specifically the P-type doped regions, P-type doping sources containing boron, aluminum, gallium or the like (such as borosilicate glass) are deposited inside the recesses for doping to form P-type amorphous silicon/P-type silicon carbide, and then N-type doping sources containing nitrogen, phosphorus, arsenic or the like (such as phosphosilicate glass) are deposited on part of regions outside the recesses for doping to form N-type amorphous silicon/N-type silicon carbide; and after the P-type doping sources and the N-type doping sources are alternately deposited inside and outside the recesses, high-temperature crystallization treatment is performed so that the original intrinsic amorphous silicon or intrinsic silicon carbide is changed into doped polycrystalline silicon or doped silicon carbide. It should be indicated that after the different doping sources are deposited for doping and after high-temperature crystallization treatment is completed, it is also required to remove the doping sources through laser or the like.

The mask comprises a hard mask, a silicon nitride mask, a silicon oxide mask, a photoresist mask, etc. When the mask is specifically a hard mask, for example, the protrusion of the silicon substrate is first covered through the hard mask, then a first-type doping source is deposited inside the recesses, then the recesses thereof are further covered through the hard mask, and then a second-type doping source is partially deposited outside the recesses, so that different doping types of doping sources are respectively deposited inside and outside the recesses for doping. Moreover, when the mask is specifically the silicon nitride mask, for example, silicon nitride is first deposited on the back; the recesses are then perforated through laser perforation to remove silicon nitride inside the recesses; a first-type doping source is deposited inside the recesses; silicon oxide is continuously deposited on the back so that silicon nitride covers the first-type doping source for protection; the protrusions are perforated through laser perforation to remove silicon nitride and the first-type doping source on the protrusions; a second-type doping source is deposited on the protrusions; the second-type doping source and silicon nitride deposited in the recesses are removed through laser perforation, so that different doping types of doping sources are deposited inside and outside the recesses for doping. The silicon oxide mask is similar to the silicon nitride mask, and thus is no longer described herein for conciseness.

In a feasible solution, specifically, intrinsic amorphous silicon or intrinsic silicon carbide is deposited inside and outside the recesses; different doping types of source gases are introduced inside the recesses with a mask method for doping, for example, when the first doped regions are the P-type doped regions, P-type source gases containing elements such as boron, aluminum, gallium or the like (such as a borane gas or a carrier gas carrying boron trichloride or boron tribromide) are introduced inside the recesses for doping to form P-type amorphous silicon/P-type silicon carbide, and then N-type source gases containing elements such as nitrogen, phosphorus, arsenic or the like (such as a phosphorane gas or a carrier gas carrying phosphorus oxychloride) are introduced on part of regions outside the recesses for doping to form N-type amorphous silicon/N-type silicon carbide; and after the first-type source gas and the second-type source gas of different doping types are alternately introduced inside and outside the recesses, high-temperature crystallization treatment is performed so that the original intrinsic amorphous silicon or intrinsic silicon carbide is changed into doped polycrystalline silicon or doped silicon carbide. The mask comprises a hard mask, a silicon nitride mask, a silicon oxide mask, a photoresist mask, etc. The specific implementation may refer to the preceding text.

Specifically, in another embodiment of the disclosure, when adopting ex-situ deposition, step S31 may further comprise:

depositing intrinsic amorphous silicon or intrinsic silicon carbide inside and outside the recesses; and alternately performing different types of diffusions inside and outside the recesses through a mask, so that the intrinsic amorphous silicon or intrinsic silicon carbide is changed into doped polycrystalline silicon or doped silicon carbide to obtain the first doped regions disposed inside the recesses and the second doped regions outside the recesses.

In a feasible solution, specifically, intrinsic amorphous silicon or intrinsic silicon carbide is deposited inside and outside the recesses; and then first-type diffusion is directly performed inside the recesses with a mask method to form the first doped regions, and second-type diffusion is performed on part of regions outside the recesses to form the second doped regions, for example, when the first doped regions are the P-type doped regions, boron diffusion is performed inside the recesses to form the P-type doped regions, and phosphorus diffusion is performed on part of regions outside the recesses to form the N-type doped regions. The mask comprises a hard mask, a silicon nitride mask, a silicon oxide mask, a photoresist mask, etc. The specific implementation may refer to the preceding text.

It should be indicated that in the process of alternately preparing the first doped regions and the second doped regions, since the high-temperature crystallization process is needed, the thin first dielectric layer may be partially broken. In this case, in the high-temperature diffusion process, attachment may occur at the broken part of the first dielectric layer and the back surface of the silicon substrate, and then a plurality of inner diffusion regions corresponding to the first doped regions or the second doped regions are formed on the surface of the silicon substrate in contact with the first dielectric layer.

Specifically, the first doped regions and the second doped regions are alternately prepared inside and outside the recesses, where the plurality of first doped regions and the plurality of second doped regions comprise doped polycrystalline silicon or doped silicon carbide or doped amorphous silicon, and the total thickness of the first dielectric layer and the plurality of first doped regions or the plurality of second doped regions is greater than 20 nm.

At step S41, a second dielectric layer and a third dielectric layer are respectively prepared on the back and front surface of the silicon substrate.

Before step S41, the method may further comprise: alternately performing different types of diffusion on the positions on the back surface of the silicon substrate between the first doped regions and the second doped regions, to obtain different types of the third doped regions by diffusion on part of the positions of the protrusions on the back surface of the silicon substrate. When the third doped region is the P-type diffusion layer, the specific preparation process comprises: way I: introducing a source gas containing elements such as boron, aluminum, gallium or the like (such as a borane gas or a carrier gas carrying boron trichloride or boron tribromide) for thermal diffusion to form the P-type diffusion layer; way II: depositing a doping source containing boron, aluminum, gallium or the like (such as borosilicate glass) for thermal diffusion to form the P-type diffusion layer; way III: preparing an aluminum electrode above the diffusion layer and forming the P-type diffusion layer doped with aluminum in a high-temperature process; way IV: spin-coating a doping source containing boron, aluminum, gallium or the like (such as boron tribromide) for thermal diffusion to form the P-type diffusion layer; and way V: injecting ions containing elements such as boron, aluminum, gallium or the like and performing high-temperature diffusion to form the P-type diffusion layer.

When the third doped region is the N-type diffusion layer, the specific preparation process comprises: way I: introducing a source gas containing elements such as nitrogen, phosphorus, arsenic or the like (such as a phosphorane gas or a carrier gas carrying phosphorus oxychloride) for thermal diffusion to form the N-type diffusion layer; way II: depositing a doping source containing nitrogen, phosphorus, arsenic or the like (such as phosphosilicate glass) for thermal diffusion to form the N-type diffusion layer; way III: spin-coating a doping source containing nitrogen, phosphorus, arsenic or the like (such as phosphorus oxychloride) for thermal diffusion to form the N-type diffusion layer; and way IV: injecting ions containing elements such as nitrogen, phosphorus, arsenic or the like and performing high-temperature diffusion to form the N-type diffusion layer. It should be indicated that after a doping source is deposited for thermal diffusion, it is also required to remove the doping source through laser or the like.

Furthermore, before step S41, the method may further comprise: texturing the positions between the first doped regions and the second doped regions on the back surface of the silicon substrate to obtain the rough texture structure. The specific texturing process may refer to the preceding text.

Specifically, in the process of respectively preparing the second dielectric layer and the third dielectric layer on the back and front surface of the silicon substrate, the preparation is implemented depending on the specific composition types of the second dielectric layer and the third dielectric layer, which is not specifically limited therein. Correspondingly, the second dielectric layer and the third dielectric layer may be one of an aluminum oxide layer, a silicon nitride layer, a silicon oxynitride layer, a silicon carbide layer, an intrinsic amorphous silicon layer and a silicon oxide layer, or a combination thereof. In addition, when the second dielectric layer and the third dielectric layer each are set to have a multi-layer structure, the refractive index of each layer is set to successively decrease outward from the silicon substrate, and a magnesium fluoride layer having the lowest requirement for the refractive index may be prepared at the outermost layer.

In addition, before the third dielectric layer is prepared on the front surface of the silicon substrate, an electric field layer or a floating junction may be prepared first, specifically comprising performing phosphorus diffusion on the silicon substrate to obtain the electric field layer or performing boron diffusion to obtain the floating junction. In this case, the electric field layer or the floating junction serves as the FSF of the selective contact region buried solar cell.

At step S51, a conductive layer is prepared on the first doped regions and the second doped regions.

Specifically, when the second dielectric layer only covers regions between the first doped regions and the second doped regions in the silicon substrate, the conductive layer covers the entire back of the first doped regions and the second doped regions for electrical connection; when the second dielectric layer extends to cover the first doped regions and the second doped regions, the conductive layer covers the back of the remaining part that does not cover the second dielectric layer in the first doped regions and the second doped regions; and when the second dielectric layer covers the entire back surface of the silicon substrate, the conductive layer passes through the second dielectric layer as well as the first doped regions and the second doped regions through perforation or the like for electrical connection, so that first electrodes are formed on the first doped regions and second electrodes are formed on the second doped regions.

When the back contact structure applied to HBC cells (IBC heterojunction solar cells) manufactured in low-temperature processes is prepared, the conductive layer is the TCO film and the metal electrode, and when the back contact structure applied to POLO-IBC cells (passivated contact IBC cells) manufactured in high-temperature processes is prepared, the conductive layer is the metal electrode. Meanwhile, the metal electrode comprises a silver electrode, a copper electrode, an aluminum electrode, a tin-clad copper electrode, or a silver-clad copper electrode. Furthermore, the copper electrode is electro-plated copper prepared through an electroplating process or a copper electrode prepared through physical vapor deposition. The electro-plated copper uses nickel, chromium, titanium, and tungsten electrodes as a seed layer or a protection layer thereof The embodiment of the disclosure has the following beneficial effects with respect to the related art:

1. The recesses are disposed at intervals on the back surface of the silicon substrate; moreover, first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, and preparation of the recesses is easier than preparation of the existing trench; moreover, when depositing the first dielectric layer and the first doped regions inside the recesses, the deposition effect thereof is better.

2. Since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed is at least one in number, multi-layer passivation is performed on the back surface of the silicon substrate through the second dielectric layer having at least one layer, to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. When the hard mask is used to selectively deposit the first doped regions or the second doped regions, for example, when the hard mask is used to deposit the first doped regions in the recess regions, the hard mask can be used to cover the protrusions outside the recesses. Moreover, since a recess has a specific depth, the hard mask will not be in direct contact with the bottom of the recess, so that the deposition effect is better. In addition, since the recesses are separated by the silicon substrate protrusion structure having a specific width, when the hard mask is used for covering to perform deposition of the recess regions, accurate alignment of the hard mask is not required and a moderate amount of deviation is allowed, so that the alignment of the hard mask gets simpler and then the technological difficulty is reduced.

6. In the related art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recess is the protrusion, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

7. Since the third doped regions are disposed on regions between the first doped regions and the second doped regions in the silicon substrate, it would be easier for the carriers in a third doped region to selectively pass through the first dielectric layer on the sidewall of the adjacent recess to be separated and collected into the corresponding plurality of first doped regions and to selectively pass through the first dielectric layer on the protrusion to be separated and collected into the corresponding second doped region.

Embodiment 4

The fourth embodiment of the disclosure further provides a cell assembly comprising the selective contact region buried solar cell according to the preceding embodiment.

In the cell assembly in this embodiment, through the selective contact region buried solar cell provided, recesses are disposed at intervals on a back of a silicon substrate, and first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, and preparation of the recesses is easier than preparation of the existing trench. Further, when a first dielectric layer and first doped regions are deposited inside the recesses, the deposition effect is better. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

Embodiment 5

The fifth embodiment of the disclosure further provides a photovoltaic system comprising the cell assembly according to the preceding embodiments.

In the photovoltaic system in this embodiment, through the selective contact region buried solar cell provided in the cell assembly, recesses are disposed at intervals on a back of a silicon substrate, and first doped regions are disposed inside the recesses and second doped regions are disposed outside the recesses, so that separation between the first doped regions inside the recesses and the second doped regions outside the recesses is implemented through a silicon substrate inside the recesses that is not covered by the first doped regions or a silicon substrate outside the recesses that is not covered by the second doped regions; moreover, the recesses disposed have a higher tolerance in width control requirement than existing trench, and preparation of the recesses is easier than preparation of the existing trench. Further, when a first dielectric layer and first doped regions are deposited inside the recesses, the deposition effect is better. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and then a better passivation effect is yielded and inner back reflection is enhanced, thereby yielding a better passivation effect and a better inner back reflection effect and solving the existing problems of a high trench width control requirement and a poor passivation effect.

It will be obvious to those skilled in the art that changes and modifications may be made, and therefore, the aim in the appended claims is to cover all such changes and modifications.

What is claimed is:

1. A back contact structure of a solar cell, the back contact structure comprising:
   a silicon substrate, the silicon substrate comprising a back surface comprising a plurality of recesses disposed at intervals and a plurality of interval portions between every two of the plurality of recesses, each of the plurality of interval portions comprising two side portions and a middle portion, the two side portions being respectively adjacent to two of the plurality of recesses adjacent to the each of the plurality of interval portions, and the middle portion being disposed between the two side portions;
   a first dielectric layer disposed on the back surface of the silicon substrate;
   a plurality of first doped regions disposed on the first dielectric layer and disposed inside the plurality of recesses, wherein:
      a depth of each of the plurality of recesses is greater than a sum of a thickness of the first dielectric layer and a thickness of each of the plurality of first doped regions that are disposed inside the each of the plurality of recesses; and
      the plurality of first doped regions is entirely enclosed inside the plurality of recesses, respectively;
   a plurality of second doped regions each comprising a bottom surface and a top surface opposite the bottom surface, wherein the plurality of second doped regions is disposed on the first dielectric layer, thereby the bottom surface of each of the plurality of second doped regions is directly connected to the first dielectric layer; and the plurality of second doped regions is disposed outside the plurality of recesses, and the plurality of second doped regions is enclosed only on the middle portion, thereby the plurality of second doped regions is spatially separated from the plurality of first doped regions disposed inside the plurality of recesses;
   a second dielectric layer disposed between each of the plurality of first doped regions and an adjacent one of the plurality of second doped regions and disposed on the plurality of second doped regions, thereby the second dielectric layer covers at least a portion of the top surface of each of the plurality of second doped regions; wherein:
      the first dielectric layer and the second dielectric layer are distinct;
      the second dielectric layer comprises at least one sub-layer; and
      the second dielectric layer covers side walls of each of the plurality of recesses; and
   a conductive layer directly disposed on the plurality of first doped regions and the plurality of second doped regions.

2. The structure of claim 1, wherein the plurality of first doped regions is P-type doped, and the plurality of second doped regions is N-type doped; or the plurality of first doped regions is N-type doped, and the plurality of second doped regions is P-type doped.

3. The structure of claim 1, wherein the plurality of second doped regions are disposed on part of regions of the first dielectric layer outside the plurality of recesses.

4. The structure of claim 1, wherein the plurality of first doped regions and the plurality of second doped regions comprise doped polycrystalline silicon, doped silicon carbide or doped amorphous silicon.

5. The structure of claim 1, wherein the first dielectric layer comprises a tunneling oxide layer, an intrinsic silicon carbide layer, an intrinsic amorphous silicon layer, or a combination thereof.

6. The structure of claim 1, wherein the second dielectric layer comprises an aluminum oxide layer, a silicon nitride layer, a silicon oxynitride layer, an intrinsic silicon carbide layer, an intrinsic amorphous silicon layer, a silicon oxide layer, or a combination thereof.

7. The structure of claim 1, wherein the second dielectric layer covers regions between the plurality of first doped regions and the plurality of second doped regions, or extends to cover the plurality of first doped regions and/or the plurality of second doped regions.

8. The structure of claim 1, wherein a part of the back surface of the silicon substrate between the plurality of first doped regions and the plurality of second doped regions comprises a rough texture structure.

9. The structure of claim 2, wherein when the plurality of first doped regions are P-type doped and the plurality of second doped regions are N-type doped, a width of each of the plurality of first doped regions is 300-600 μm, a width of each of the plurality of second doped regions is 100-500 μm, and a depth of the plurality of recesses is 0.01-10 μm.

10. The structure of claim 1, wherein a horizontal distance between the plurality of first doped regions and the plurality of second doped regions is 0-500 μm.

11. The structure of claim 1, wherein the first dielectric layer covers the plurality of first doped regions and the plurality of second doped regions, or covers the back surface of the silicon substrate.

12. The structure of claim 1, wherein a plurality of third doped regions is disposed in the silicon substrate located on regions between the plurality of first doped regions and the plurality of second doped regions.

13. The structure of claim 1, wherein the first dielectric layer is connected to bottom walls and sidewalls of the plurality of recesses.

14. The structure of claim 1, wherein the plurality of recesses is in the shape of an arc, a trapezoid, or a square.

15. The structure of claim 1, wherein a thickness of the first dielectric layer is 1-20 nm, and a total thickness of the first dielectric layer and the plurality of first doped regions or the plurality of second doped regions is greater than 20 nm.

16. The structure of claim 5, wherein the first dielectric layer is the tunneling oxide layer and the intrinsic silicon carbide layer.

17. The structure of claim 6, wherein the second dielectric layer comprises the aluminum oxide layer and the intrinsic silicon carbide layer, or the second dielectric layer comprises the silicon oxide layer and the intrinsic silicon carbide layer, and a thickness of the second dielectric layer is greater than 25 nm.

18. The structure of claim 17, wherein a thickness of the aluminum oxide layer or the silicon oxide layer in the second dielectric layer is less than 25 nm, and a thickness of the intrinsic silicon carbide layer in the second dielectric layer is greater than 10 nm.

19. The structure of claim 6, wherein a magnesium fluoride layer is disposed on an outer layer of the second dielectric layer.

20. The structure of claim 1, wherein the conductive layer comprises a transparent conductive oxide (TCO) film and/or a metal electrode.

21. The structure of claim 20, wherein the metal electrode comprises a silver electrode, a copper electrode, an aluminum electrode, a tin-clad copper electrode, or a silver-clad copper electrode.

22. The structure of claim 11, wherein a first portion of the first dielectric layer supporting the plurality of first doped regions is different from a second portion of the first dielectric layer supporting the plurality of second doped regions.

23. A selective contact region buried solar cell, comprising:
    a back contact structure of claim 1; and
    a third dielectric layer disposed on a front surface of the silicon substrate.

24. The cell of claim 23, wherein the third dielectric layer comprises an aluminum oxide layer, a silicon nitride layer, a silicon oxynitride layer, a silicon carbide layer, an intrinsic amorphous silicon layer, a silicon oxide layer, or a combination thereof.

25. The cell of claim 24, wherein the third dielectric layer comprises the silicon oxide layer and the silicon carbide layer, or the third dielectric layer comprises the aluminum oxide layer and the silicon carbide layer, and a thickness of the third dielectric layer is greater than 50 nm.

26. The cell of claim 25, wherein a thickness of the aluminum oxide layer or the silicon oxide layer in the third dielectric layer is less than 40 nm, and a thickness of the silicon carbide layer in the third dielectric layer is greater than 10 nm.

27. The cell of claim 24, wherein the silicon carbide layer in the third dielectric layer comprises at least one silicon carbide film; and refractive indexes of different silicon carbide films decrease from the front surface of the silicon substrate to outside.

28. The cell of claim 24, wherein a magnesium fluoride layer is disposed at an outer layer of the third dielectric layer.

29. A cell assembly, comprising the selective contact region buried solar cell of claim 23.

30. A photovoltaic system, comprising the cell assembly of claim 29.

* * * * *